US012633920B2

(12) United States Patent
Terauchi et al.

(10) Patent No.: US 12,633,920 B2
(45) Date of Patent: May 19, 2026

(54) INPUT BUFFER CIRCUIT HAVING VARIABLE THRESHOLD CIRCUITS

(71) Applicant: TAIWAN SEMICONDUCTOR MANUFACTURING COMPANY, LTD., Hsinchu (TW)

(72) Inventors: Ryota Terauchi, Hsinchu (TW); Yu-Kai Tsai, Hsinchu (TW); Chia-Jung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 43 days.

(21) Appl. No.: 18/587,077

(22) Filed: Feb. 26, 2024

(65) Prior Publication Data

US 2025/0274122 A1     Aug. 28, 2025

(51) Int. Cl.
*H03K 19/00*         (2006.01)
*H03K 17/687*        (2006.01)

(52) U.S. Cl.
CPC ..... *H03K 19/0027* (2013.01); *H03K 17/6872* (2013.01); *H03K 17/6874* (2013.01)

(58) Field of Classification Search
CPC ........... H03K 19/0027; H03K 17/6872; H03K 17/6874; H03K 19/0021; H03K 19/00323; H03K 19/00315; H03K 19/00361; H03K 19/00384; H03K 17/687; H03K 17/04106; H03K 17/041; H03K 17/04123; H03K 17/0412; H03K 17/0416; H03K 17/04163; H03K 17/04206; H03K 17/042; H03K 17/063; H03K 17/08122; H03K 17/0812; H03K 17/08142; H03K 17/0814;
(Continued)

(56) References Cited

U.S. PATENT DOCUMENTS

| | | |
|---|---|---|
| 5,003,196 A | 3/1991 | Kawaguchi |
| 5,278,462 A | 1/1994 | Wilson |

(Continued)

FOREIGN PATENT DOCUMENTS

| | | |
|---|---|---|
| DE | 4215423 | 11/1993 |
| EP | 0107189 | 5/1984 |

(Continued)

*Primary Examiner* — Jung Kim
(74) *Attorney, Agent, or Firm* — Hauptman Ham, LLP

(57)     ABSTRACT

An integrated circuit includes an asymmetry upper threshold circuit outputting an upper-branch enabling signal, an asymmetry lower threshold circuit outputting a lower-branch enabling signal, and a control circuit which changes an output voltage when the logic levels of the upper-branch enabling signal and the lower-branch enabling signal are changed consecutively. The upper-branch enabling signal is set to a first upper-branch logic level when an input voltage received by the integrated circuit rises across a main upper threshold, and to a second upper-branch logic level when the input voltage falls across a supplementary upper threshold which is higher than the main upper threshold. The lower-branch enabling signal is set to a first lower-branch logic level when the input voltage falls across a main lower threshold, and to a second lower-branch logic level when the input voltage rises across a supplementary lower threshold which is lower than the main lower threshold.

20 Claims, 10 Drawing Sheets

(58) Field of Classification Search

CPC ............. H03K 17/0822; H03K 17/082; H03K 17/302; H03K 17/30

See application file for complete search history.

(56) References Cited

U.S. PATENT DOCUMENTS

| | | | |
|---|---|---|---|
| 5,432,432 | A | 7/1995 | Kimuar |
| 6,870,413 | B1 * | 3/2005 | Chang ................. H03K 3/3565 |
| | | | 327/205 |
| 7,652,520 | B2 | 1/2010 | Gatta |
| 11,863,189 | B2 | 1/2024 | Tsai et al. |
| 2001/0011915 | A1 | 8/2001 | Aoki |
| 2007/0297812 | A1 | 12/2007 | Takeuchi et al. |
| 2010/0301900 | A1 | 12/2010 | Deng |
| 2017/0077837 | A1 | 3/2017 | Gu et al. |
| 2021/0013873 | A1 | 1/2021 | Chen et al. |
| 2021/0159890 | A1 | 5/2021 | Tercariol et al. |
| 2022/0123738 | A1 | 4/2022 | Gupta et al. |
| 2022/0286117 | A1 | 9/2022 | Tsai et al. |

FOREIGN PATENT DOCUMENTS

| | | |
|---|---|---|
| EP | 0690570 | 1/1996 |
| JP | 57-75024 | 5/1982 |
| JP | 62-298218 | 12/1987 |
| TW | 521488 | 2/2003 |
| TW | I774386 | 8/2022 |

* cited by examiner

700

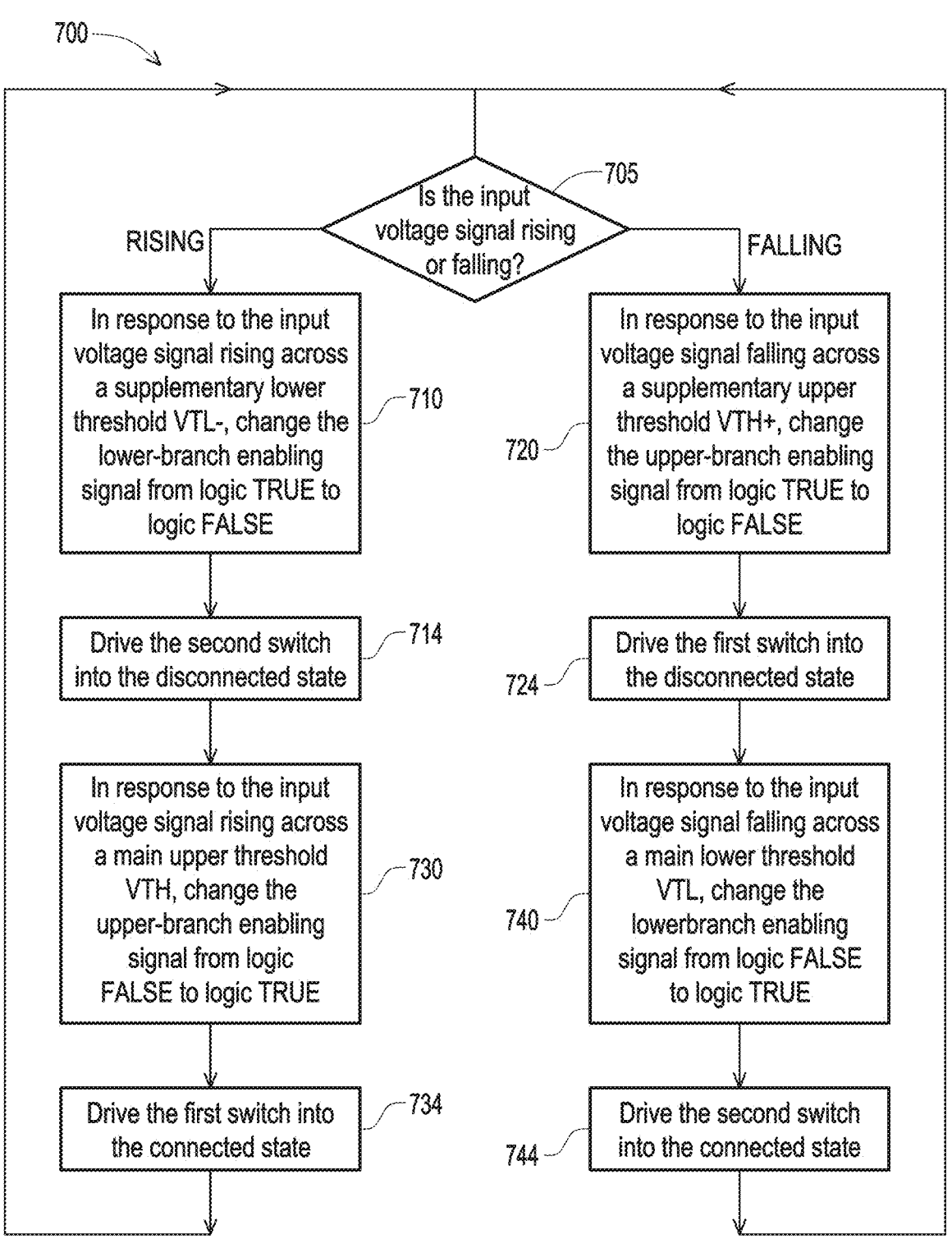

705

Is the input voltage signal rising or falling?

RISING

FALLING

In response to the input voltage signal rising across a supplementary lower threshold VTL-, change the lower-branch enabling signal from logic TRUE to logic FALSE — 710

In response to the input voltage signal falling across a supplementary upper threshold VTH+, change the upper-branch enabling signal from logic TRUE to logic FALSE — 720

Drive the second switch into the disconnected state — 714

Drive the first switch into the disconnected state — 724

In response to the input voltage signal rising across a main upper threshold VTH, change the upper-branch enabling signal from logic FALSE to logic TRUE — 730

In response to the input voltage signal falling across a main lower threshold VTL, change the lowerbranch enabling signal from logic FALSE to logic TRUE — 740

Drive the first switch into the connected state — 734

Drive the second switch into the connected state — 744

FIG. 7

INPUT BUFFER CIRCUIT HAVING VARIABLE THRESHOLD CIRCUITS

CROSS-REFERENCE TO RELATED APPLICATIONS

The present application is related to U.S. application Ser. No. 17/338,107, filed Jun. 3, 2021, and titled, "Input Buffer Circuit," which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart of a method of generating an output voltage signal from an input voltage signal, in accordance with some embodiments.

DETAILED DESCRIPTION

Figure 1A:
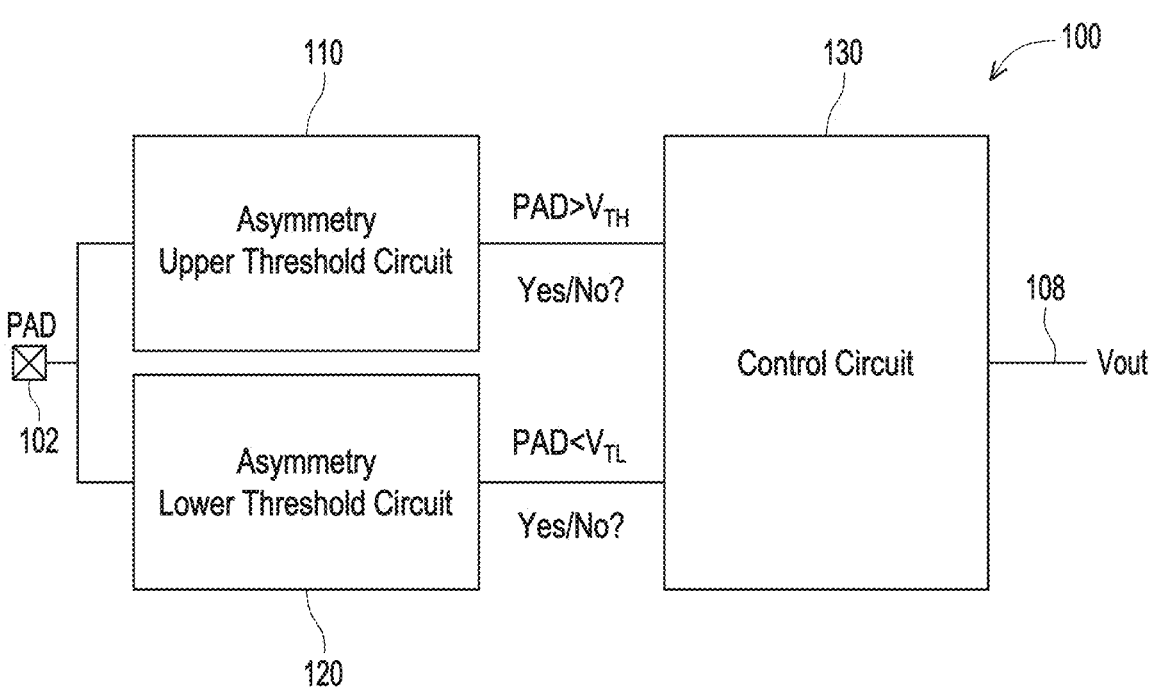
FIG. 1A is a schematic diagram of an input buffer circuit having two threshold circuits and one control circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An input buffer circuit couples an input voltage signal from a transmitting circuit in a first power domain to a receiving circuit in a second power domain. The input buffer circuit receives the input voltage signal and generates an output voltage signal. The input buffer circuit has a lower threshold voltage and an upper threshold voltage. In some embodiments, an upper-branch enabling signal is generated based on a comparison between the input voltage signal and the upper threshold voltage, and a lower-branch enabling signal is generated based on a comparison between the input voltage signal and the lower threshold voltage. In some embodiments, based on the upper-branch enabling signal and the lower-branch enabling signal, the output voltage signal changes between a first voltage level and a second voltage level. When the input voltage signal rises and consecutively crosses the lower threshold voltage and then the upper threshold voltage, the output voltage signal changes from the first voltage level to the second voltage level. When the input voltage signal falls and consecutively crosses the upper threshold voltage and then the lower threshold voltage, the output voltage signal changes from the second voltage level to the first voltage level.

FIG. 1A is a schematic diagram of an input buffer circuit 100 having two threshold circuits and one control circuit, in accordance with some embodiments. The input buffer circuit 100 includes an asymmetry upper threshold circuit 110, an asymmetry lower threshold circuit 120, and a control circuit 130. The asymmetry upper threshold circuit 110 and the asymmetry lower threshold circuit 120 are configured to receive an input voltage signal PAD at an input node 102 of the input buffer circuit 100. The asymmetry upper threshold circuit 110 is configured to generate an upper-branch enabling signal $EN_{up}$ based on a comparison between the input voltage signal PAD and the upper threshold voltage VTH. In some embodiments, if the input voltage signal PAD is larger than the upper threshold voltage VTH, then the upper-branch enabling signal $EN_{up}$ generated by the asymmetry upper threshold circuit 110 is set to be logic TRUE.

The asymmetry lower threshold circuit 120 is configured to generate a lower-branch enabling signal $EN_{dn}$ based on a comparison between the input voltage signal PAD and the lower threshold voltage VTL. In some embodiments, if the input voltage signal PAD is smaller than the lower threshold voltage VTL, then the lower-branch enabling signal $EN_{dn}$ generated by the asymmetry lower threshold circuit 120 is set to be logic TRUE. The upper-branch enabling signal $EN_{up}$ and the lower-branch enabling signal $EN_{dn}$ are coupled to the control circuit 130. The control circuit 130 is configured to generate an output voltage signal Vout at the output node 108 of the control circuit 130 based on the upper-branch enabling signal $EN_{up}$ and the lower-branch enabling signal $EN_{dn}$.

In operation, the input voltage signal PAD at the input node 102 is provided by electronic circuits in a first power domain, and the output voltage signal Vout generated by the input buffer circuit 100 at the output node 108 is coupled to electronic circuits in a second power domain. In some embodiments, the electronic circuits in the first power domain are connected between the power supply voltages VDDH and VSS, and the electronic circuits in the second power domain are connected between the power supply voltages VDDL and VSS. In some embodiments, the power supply voltage VSS is connected to the common ground, and the power supply voltage VDDH in the first power domain is 2.5V (or 3.3V) while the power supply voltage VDDL in the second power domain is 1.8V. In some embodiments, the power supply voltage VSS is connected to common ground, and the power supply voltage VDDH in the first power domain is 1.8V (or 2.5V) while the power supply voltage VDDL in the second power domain is 1.2V. In some embodiments, the power supply voltage VDDH is higher than 3.3V. In some embodiments, the power supply voltage VDDL is smaller than 1.2 V. Other examples of the power supply voltage VDDH and the power supply voltage VDDL are within the contemplated scope of the present disclosure. During operation, the voltage levels of the input voltage signal PAD at the input node 102 of the input buffer circuit 100 generally are in a range from VSS to VDDH, and the output voltage signal Vout generated at the output node 108 of the input buffer circuit 100 is in a range from VSS to VDDL.

The output voltage signal Vout at the output node 108 of the input buffer circuit 100 changes in response to the input voltage signal PAD at the input node 102. The input voltage signal PAD follows a trapezoid waveform: the input voltage signal PAD rises from voltage VSS to voltage VDDH and stays at the voltage VDDH for some time; then the input voltage signal PAD falls from voltage VDDH to voltage VSS. As the input voltage signal PAD is rising from voltage VSS and changing towards voltage VDDH, the output voltage signal Vout changes from voltage VSS to voltage VDDL at time t+, when the input voltage signal PAD crosses an upper threshold voltage VTH. The output voltage signal Vout stays at voltage VDDL, while the input voltage signal PAD reaches voltage VDDH and stays at voltage VDDH. The output voltage signal Vout changes from voltage VDDL to voltage VSS at time t−, when the input voltage signal PAD crosses a lower threshold voltage VTL, as the input voltage signal PAD is falling from voltage VDDH and changing towards voltage VSS. Because the signal waveform of the output voltage signal Vout changes within the range from VSS to VDDL, the output voltage signal Vout is a more suitable signal for the electronic circuits in the second power domain powered by the power supply voltages VDDL and VSS. In contrast, if the input voltage signal PAD is directly coupled to the electronic circuits in the second power domain, the peak voltage (such as VDDH) of the input voltage signal PAD may exceed the maximum durable voltage of the electronic circuits in the second power domain.

Figure 1B:
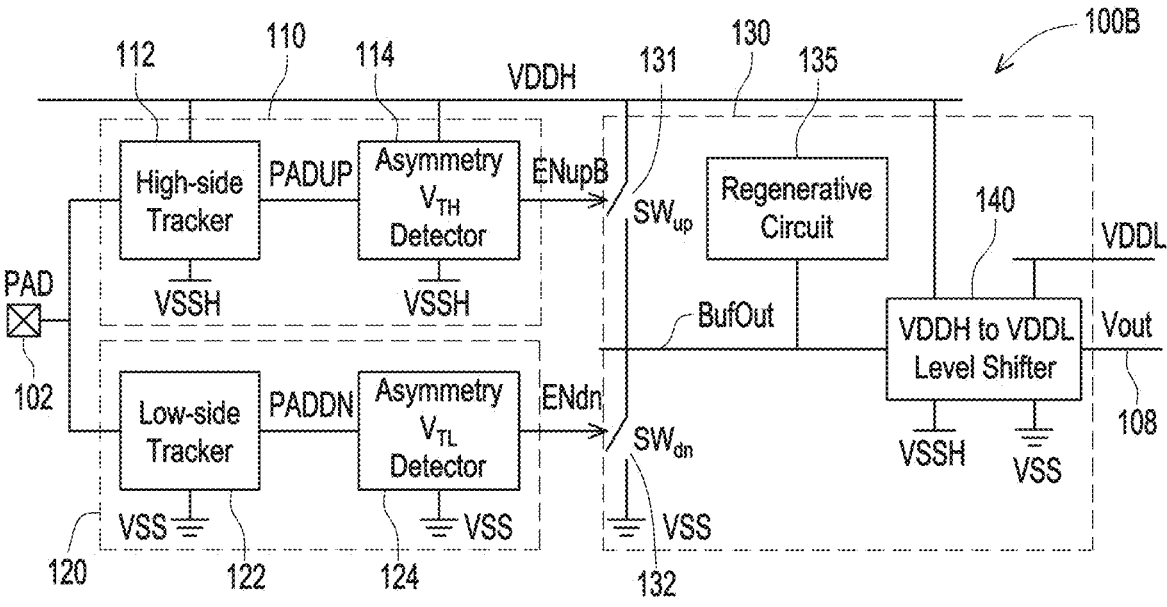
FIG. 1B is a schematic diagram of an implementation of the input buffer circuit of FIG. 1A in combination with level shifters, in accordance with some embodiments.

FIG. 1B is a schematic diagram of an input buffer circuit 100B having the control circuit implemented with switches, in accordance with some embodiments. In FIG. 1B, the asymmetry upper threshold circuit 110 includes a high-side tracker 112 and an asymmetry upper threshold detector 114. The high-side tracker 112 is configured to generate a tracking-up signal PADUP based on the input voltage signal PAD. The asymmetry upper threshold detector 114 is configured to receive the tracking-up signal PADUP from the high-side tracker 112 and to set a logic level of the upper-branch enabling signal ENUPB based on the tracking-up signal PADUP. In FIG. 1B, the asymmetry lower threshold circuit 120 includes a low-side tracker 122 and an asymmetry lower threshold detector 124. The low-side tracker 122 is configured to generate a tracking-down signal PADDN based on the input voltage signal PAD. The asymmetry lower threshold detector 124 is configured to receive the tracking-down signal PADDN from the low-side tracker 122 and to set a logic level of the lower-branch enabling signal ENDN based on the tracking-down signal PADDN.

In FIG. 1B, the control circuit 130 includes a first switch 131, a second switch 132, and a regenerative circuit 135. The first switch 131 is electrically connected between the upper supply voltage VDDH and a buffer output node BufOut. The second switch is 132 electrically connected between the buffer output node BufOut and the lower supply voltage VSS. The buffer output node BufOut is at the electric connection between the first switch 131 and the second switch 132. The regenerative circuit 135 is electrically coupled to the buffer output node BufOut. The regenerative circuit 135 maintains the voltage at the buffer output node BufOut when both the first switch 131 and the second switch 132 are at the disconnected state. The first switch 131 is controlled by the upper-branch enabling signal ENUPB received from the asymmetry upper threshold detector 114. The second switch 132 is controlled by the lower-branch enabling signal ENDN received from the asymmetry lower threshold detector 124. The buffer output node BufOut is coupled to the input terminal of the level shifter 140. The level shifter 140 is connected to the power supply VDDH in the first power domain and the power supply VDDL in the second power domain. The voltage signal at the input terminal of the level shifter 140 is within the voltage range of the first power domain, but the voltage signal at the output terminal of the level shifter 140 is within the voltage range of the second power domain. The output terminal of the level shifter 140 is the output node 108 of the input buffer circuit 100B. The output voltage signal Vout at the output node 108 of the input buffer circuit 100B is within the voltage range of the second power domain. The operation of the input buffer circuit 100B in FIG. 1B is described with reference to FIGS. 2A-2F.

Figures 2A, 2B, 2C, 2D, 2E, 2F:
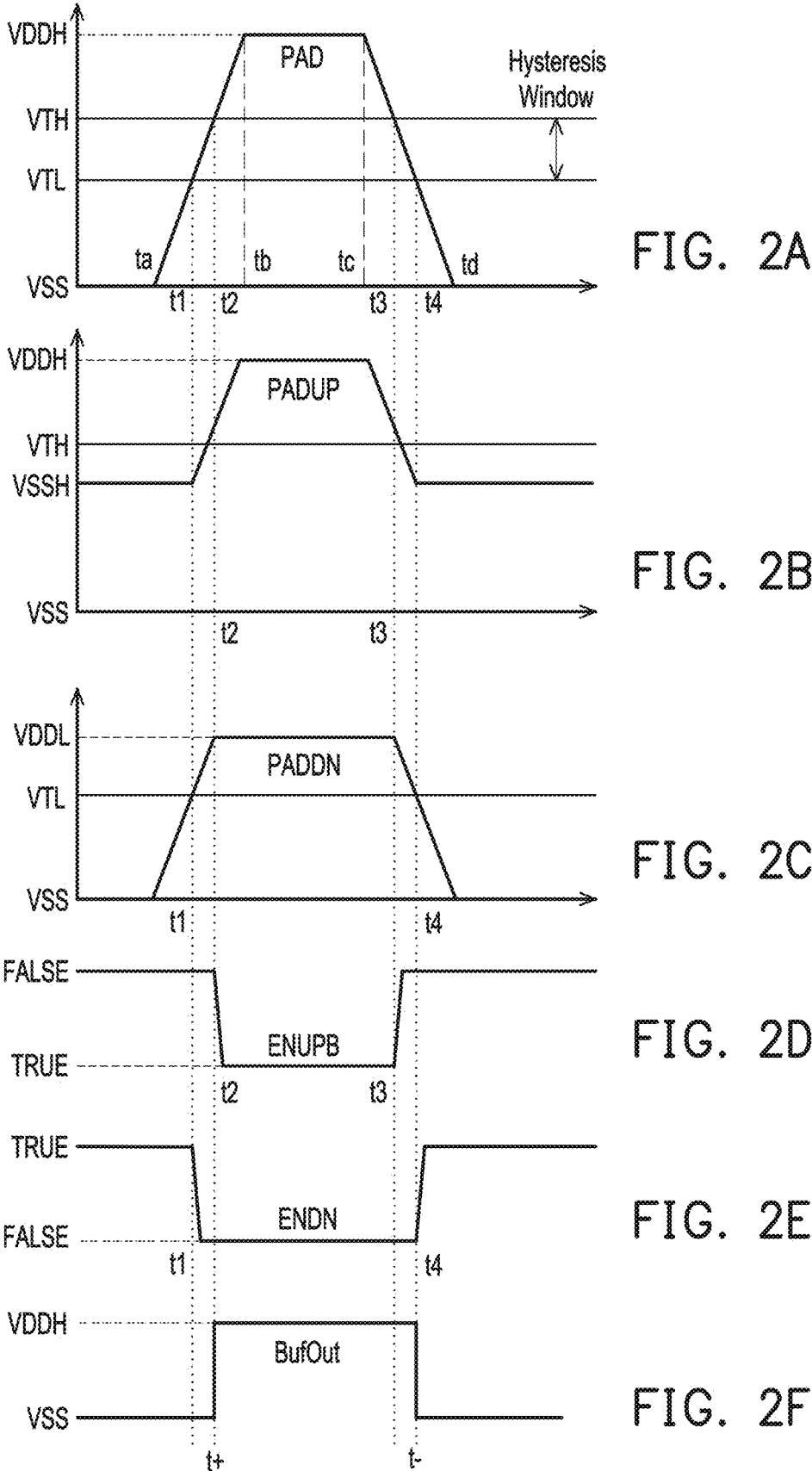
FIGS. 2A-2F are diagrams of waveforms of signals in connection with the input buffer circuit of FIG. 1B, in accordance with some embodiments.

FIGS. 2A-2F are diagrams of waveforms of signals at the input node, the output node, and various other nodes in an input buffer circuit 100B in FIG. 1B, in accordance with some embodiments. FIG. 2A is the waveform of the input voltage signal PAD at the input node 102. FIG. 2B is the waveform of the tracking-up signal PADUP at the output of the high-side tracker 112. FIG. 2C is the waveform of the tracking-down signal PADDN at the output of the low-side tracker 122. FIG. 2D is the waveform of the upper-branch enabling signal ENUPB at the output of the asymmetry upper threshold detector 114. FIG. 2E is the waveform of the lower-branch enabling signal ENDN at the output of the asymmetry lower threshold detector 124. FIG. 2F is the waveform of the voltage at the buffer output node BufOut.

In the example waveform of FIG. 2A, during the time period from ta to tb, the input voltage signal PAD rises from voltage VSS to voltage VDDH. During the time period from tb to tc, the input voltage signal PAD remains at the voltage VDDH. During the time period from tb to tc, the input voltage signal PAD is maintained at voltage VDDH. During the time period from tc to td, the input voltage signal PAD falls from voltage VDDH to voltage VSS. During the time period from ta to tb when the input voltage signal PAD is rising, the input voltage signal PAD crosses the lower threshold voltage VTL at time t1 and crosses the upper threshold voltage VTH at time t2. During the time period from tc to td when the input voltage signal PAD is falling, the input voltage signal PAD crosses the upper threshold voltage VTH at time t3 and crosses the lower threshold voltage VTL at time t4.

In the example waveform of FIG. 2B, the tracking-up signal PADUP at the output of the high-side tracker 112 follows the signal received at the input of the high-side tracker 112 if the signal received at the input is larger than a predetermined lower limiting voltage (such as VSSH), and the tracking-up signal PADUP is maintained at the predetermined lower limiting voltage (such as VSSH) if the signal received at the input is smaller than or equal to the predetermined lower limiting voltage.

In the example waveform of FIG. 2C, the tracking-down signal PADDN at the output of the low-side tracker 122 follows the signal received at the input of the low-side tracker 122 if the signal received at the input is smaller than a predetermined upper limiting voltage (such as VDDL), and the tracking-down signal PADDN is maintained at the predetermined upper limiting voltage (such as VDDL) if the signal received at the input is larger than or equal to the predetermined upper limiting voltage.

In the example waveform of FIG. 2D, the upper-branch enabling signal ENUPB at the output of the asymmetry upper threshold detector 114 is determined by comparing the tracking-up signal PADUP (received from the high-side tracker 112) with the upper threshold voltage VTH. Before time t2, the tracking-up signal PADUP in FIG. 2B is below the upper threshold voltage VTH, and the upper-branch enabling signal ENUPB in FIG. 2D is at logic FALSE. From time t2 to time t3, the tracking-up signal PADUP in FIG. 2B is above the upper threshold voltage VTH, and the upper-branch enabling signal ENUPB in FIG. 2D is at logic TRUE. After time t3, the tracking-up signal PADUP in FIG. 2B is again below the upper threshold voltage VTH, and the upper-branch enabling signal ENUPB in FIG. 2D is at logic FALSE. In the input buffer circuit 100B of FIG. 1B, the logic TRUE of the upper-branch enabling signal ENUPB is implemented with a lower voltage level, while the logic FALSE of the upper-branch enabling signal ENUPB is implemented with a higher voltage level.

In the example waveform of FIG. 2E, the lower-branch enabling signal ENDN at the output of the asymmetry lower threshold detector 124 is determined by comparing the tracking-down signal PADDN (received from the low-side tracker 122) with the lower threshold voltage VTL. Before time t1, the tracking-down signal PADDN in FIG. 2C is below the lower threshold voltage VTL, and the lower-branch enabling signal ENDN in FIG. 2E is at logic TRUE. From time t1 to time t4, the tracking-down signal PADDN in FIG. 2C is above the lower threshold voltage VTL, and the lower-branch enabling signal ENDN in FIG. 2E is at logic FALSE. After time t4, the tracking-down signal PADDN in FIG. 2C is again below the lower threshold voltage VTL, and the lower-branch enabling signal ENDN in FIG. 2E is at logic TRUE. In the input buffer circuit 100B of FIG. 1B, the logic TRUE of the lower-branch enabling signal ENDN is implemented with a higher voltage level, while the logic FALSE of the lower-branch enabling signal ENDN is implemented with a lower voltage level.

In the input buffer circuit 100B of FIG. 1B, the upper-branch enabling signal ENUPB from the asymmetry upper threshold detector 114 controls the first switch 131, and the lower-branch enabling signal ENDN received from the asymmetry lower threshold detector 124 controls the second switch 132. When the upper-branch enabling signal ENUPB is at logic TRUE, the first switch 131 is at the connected state, which connects the buffer output node BufOut with the upper supply voltage VDDH. When the lower-branch enabling signal ENDN is at logic TRUE, the second switch 132 is at the connected state, which connects the buffer output node BufOut with the lower supply voltage VSS.

In the example waveform of FIG. 2F, the voltage at the buffer output node BufOut in FIG. 1B depends upon the upper-branch enabling signal ENUPB in FIG. 2D and the lower-branch enabling signal ENDN in FIG. 2E. Before time t1, because the upper-branch enabling signal ENUPB is at logic FALSE and the lower-branch enabling signal ENDN is at logic TRUE, the buffer output node BufOut is not connected to the upper supply voltage VDDH through the first switch 131 but the buffer output node BufOut is connected to the lower supply voltage VSS through the second switch 132. Consequently, the voltage at the buffer output node BufOut is at the lower supply voltage VSS.

From time t1 to time t2, because the upper-branch enabling signal ENUPB is at logic FALSE and the lower-branch enabling signal ENDN is at logic FALSE, the buffer output node BufOut is not connected to the upper supply voltage VDDH through the first switch 131 and the buffer output node BufOut is also not connected to the lower supply voltage VSS through the second switch 132. During time t1 to time t2, however, the voltage at the buffer output node BufOut is still at the lower supply voltage VSS, because the voltage at the buffer output node BufOut at time t1 is maintained until time t2 by the regenerative circuit 135 when each of the first switch 131 and the second switch 132 is not at the connecting state.

From time t2 to time t3, because the upper-branch enabling signal ENUPB is at logic TRUE and the lower-branch enabling signal ENDN is at logic FALSE, the buffer output node BufOut is connected to the upper supply voltage VDDH through the first switch 131 but the buffer output node BufOut is not connected to the lower supply voltage VSS through the second switch 132. Consequently, the voltage at the buffer output node BufOut is at the upper supply voltage VDDH.

From time t3 to time t4, because the upper-branch enabling signal ENUPB is at logic FALSE and the lower-branch enabling signal ENDN is at logic FALSE, the buffer output node BufOut is not connected to upper supply voltage VDDH through the first switch 131 and the buffer output node BufOut is also not connected to the lower supply voltage VSS through the second switch 132. During time t3 to time t4, however, the voltage at the buffer output node BufOut is still at the upper supply voltage VDDH, because the voltage at the buffer output node BufOut at time t3 is maintained until time t4 by the regenerative circuit 135 when each of the first switch 131 and the second switch 132 is not at the connecting state.

After time t4, because the upper-branch enabling signal ENUPB is at logic FALSE and the lower-branch enabling signal ENDN is at logic TRUE, the buffer output node BufOut is not connected to the upper supply voltage VDDH through the first switch 131 rather the buffer output node BufOut is connected to the lower supply voltage VSS through the second switch 132. Consequently, the voltage at the buffer output node BufOut is at the lower supply voltage VSS.

In the example waveform of FIG. 2F, the voltage at the buffer output node BufOut changes from the lower supply voltage VSS to the upper supply voltage VDDH at time t+ (which is same as time t2), when the input voltage signal PAD crosses the upper threshold voltage VTH as the input voltage signal PAD is rising. The voltage at the buffer output node BufOut changes from the upper supply voltage VDDH to the lower supply voltage VSS at time t− (which is same as time t4) when the input voltage signal PAD crosses a lower threshold voltage VTL as the input voltage signal PAD is falling.

Figure 1C:
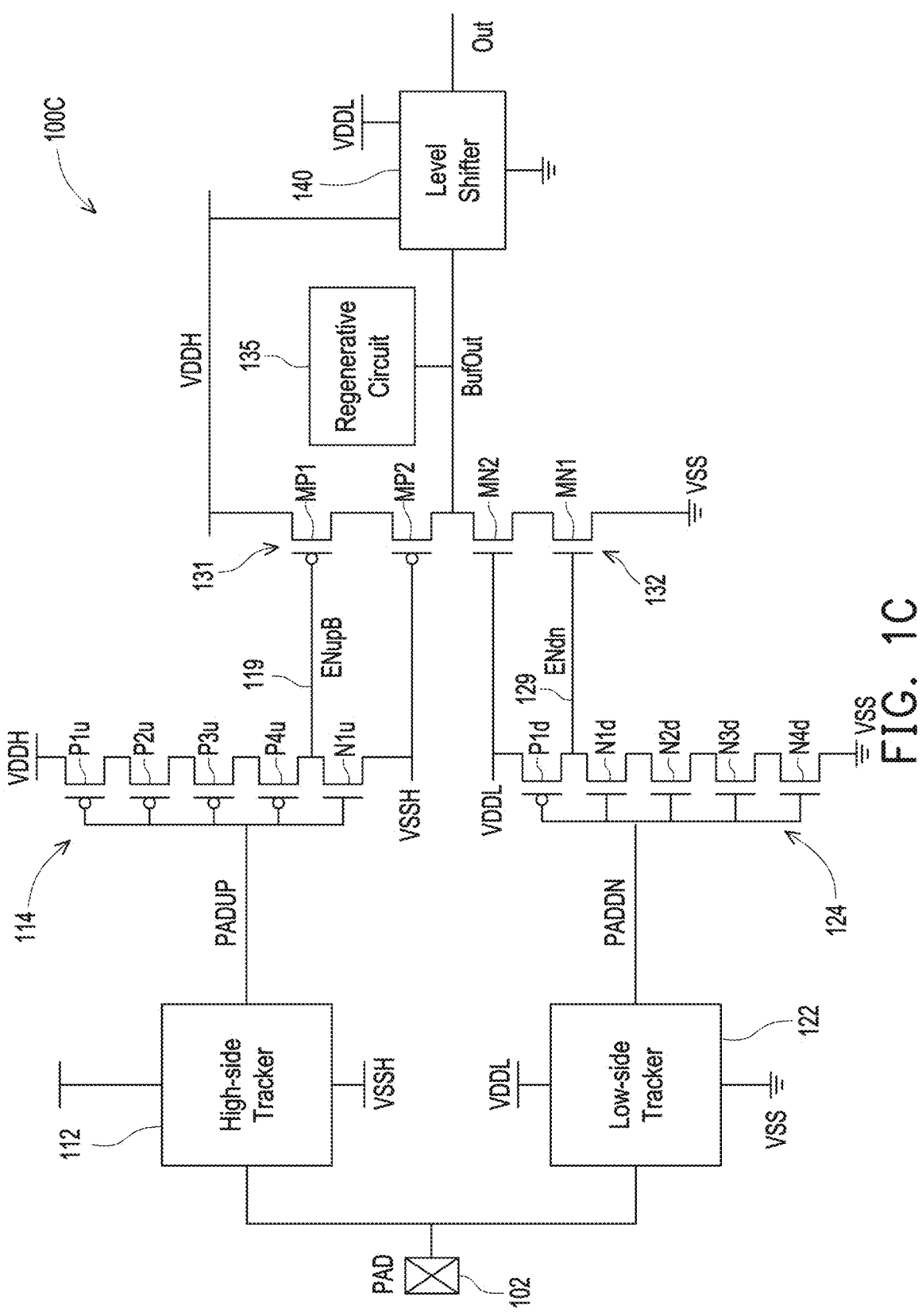
FIG. 1C is a schematic diagram of an input buffer circuit having the control circuit implemented with switches, in accordance with some embodiments.

An example implementation of the input buffer circuit 100B in FIG. 1B is the input buffer circuit as shown in FIG. 1C. FIG. 1C is a schematic diagram of an input buffer circuit 100C having the control circuit implemented with switches, in accordance with some embodiments. In the input buffer circuit 100B of FIG. 1B, each of the asymmetry upper threshold detector 114 and the asymmetry lower threshold detector 124 can be implemented based on asymmetrical MOSFET thresholds or based on symmetrical MOSFET thresholds. In the input buffer circuit 100C of FIG. 1C, each of the asymmetry upper threshold detector 114 and the asymmetry lower threshold detector 124 is implemented based on asymmetrical MOSFET thresholds. In FIG. 1C, each of the asymmetry upper threshold detector 114 and the asymmetry lower threshold detector 124 includes a plurality of first-type transistors serially connected with a second-type transistor.

In FIG. 1C, the asymmetry upper threshold detector 114 includes four PMOS transistors P1u-P4u and a NMOS transistor N1u, and the asymmetry lower threshold detector 124 includes four NMOS transistors N1d-N4d and a PMOS transistor P1d. The first switch 131, which is controlled by the asymmetry upper threshold detector 114, includes PMOS transistors MP1 and MP2. The second switch 132, which is controlled by the asymmetry lower threshold detector 124, includes NMOS transistors MN1 and MN2.

In the asymmetry upper threshold detector 114, the channels of the PMOS transistors P1u-P4u are serially connected between a constant voltage node (such as the upper supply voltage VDDH) and the drain terminal of the NMOS transistor N1u. The drain terminal of the NMOS transistor N1u is the upper-branch output node 119 of the asymmetry upper threshold detector 114. The channel of the NMOS transistor N1u is connected between the upper-branch output node 119 and the power supply voltages VSSH. The gate terminals of the PMOS transistors P1u-P4u and the NMOS transistor N1u are all connected together to receive the tracking-up signal PADUP from the high-side tracker 112. The upper-branch output node 119 is configured to output an upper-branch enabling signal ENUPB which swings between two upper-branch logic levels: a logic HIGH voltage (such as the voltage VDDH) and a logic LOW voltage (such as the voltage VSSH).

In the asymmetry lower threshold detector 124, the channels of the NMOS transistors N1d-N4d are serially connected between the drain terminal of the PMOS transistor P1d and a constant voltage node (such as the lower supply voltage VSS). The drain terminal of the PMOS transistor P1u is the lower-branch output node 129 of the asymmetry lower threshold detector 124. The channel of the PMOS transistor P1d is connected between the power supply voltage VDDL and the lower-branch output node 129. The gate terminals of the NMOS transistors N1d-N4d and the PMOS transistor P1d are all connected together to receive tracking-down signal PADDN from the low-side tracker 122. The lower-branch output node 129 of the asymmetry lower threshold detector 124 is configured to output a lower-branch enabling signal ENDN which swings between two lower-branch logic levels: a logic HIGH voltage (such as the voltage VDDL) and a logic LOW voltage (such as the voltage VSS).

In the first switch 131, the channels of the PMOS transistors MP1 and MP2 are serially connected between the upper supply voltage VDDH and the buffer output node BufOut. The gate terminal of the PMOS transistor MP1 is connected to the upper-branch output node 119 of the asymmetry upper threshold detector 114 to receive the upper-branch enabling signal ENUPB. The gate terminal of the PMOS transistor MP1 is connected to the power supply voltages VSSH.

In the second switch 132, the channels of the NMOS transistors MN2 and MN1 are serially connected between the buffer output node BufOut and the lower supply voltage VSS. The gate terminal of the NMOS transistor MN1 is connected to the lower-branch output node 129 of the asymmetry lower threshold detector 124 to receive the lower-branch enabling signal ENDN. The gate terminal of the NMOS transistor MN1 is connected to the power supply voltage VDDL.

In operation, if an input voltage signal PAD as shown in FIG. 2A is coupled to the input node 102 of the input buffer circuit 100C in FIG. 1C, the voltage at the buffer output node BufOut of the input buffer circuit 100C has the waveform as shown in FIG. 2F.

Before time t1, the tracking-up signal PADUP at the output of the high-side tracker 112 as induced by the input voltage signal PAD is below the upper threshold voltage VTH of the asymmetry upper threshold detector 114, and the logic HIGH voltage (such as the voltage VDDH) at the output of the asymmetry upper threshold detector 114 drives the PMOS transistor MP1 into the non-conducting state. As the PMOS transistor MP1 is driven into the non-conducting state, the first switch 131 is driven into the disconnected state. Here, the logic HIGH voltage (such as the voltage VDDH) of the upper-branch enabling signal ENUPB at the output of the asymmetry upper threshold detector 114 is logic FALSE for the purpose of controlling the first switch 131. Additionally, before time t1, the tracking-down signal PADDN at the output of the low-side tracker 122 as induced by the input voltage signal PAD is below the lower threshold voltage VTL of the asymmetry lower threshold detector 124, and the logic HIGH voltage (such as the voltage VDDL) at the output of the asymmetry lower threshold detector 124 drives the NMOS transistor MN1 into the conducting state. In response to both the NMOS transistors MN1 and MN2 being at the conducting state, the second switch 132 is driven into the connected state. Here, the logic HIGH voltage (such as the voltage VDDL) of the lower-branch enabling signal ENDN at the output of the asymmetry lower threshold detector 124 is logic TRUE for the purpose of controlling the second switch 132.

Before time t1, as shown in FIG. 2F, the buffer output node BufOut is at voltage VSS, in response to the condition that the first switch 131 is at the disconnected state and the second switch 132 is at the connected state.

From time t1 to time t2, the tracking-up signal PADUP is still below the upper threshold voltage VTH of the asymmetry upper threshold detector 114, and the output of the asymmetry upper threshold detector 114 is still at the logic HIGH voltage (such as the voltage VDDH) which drives the PMOS transistor MP1 into the non-conducting state. Consequently, the first switch 131 is still at the disconnected state, while the PMOS transistor MP1 is maintained at the non-conducting state. On the other hand, as the tracking-down signal PADDN rises above the lower threshold voltage VTL of the asymmetry lower threshold detector 124 at time t1, the output of the asymmetry lower threshold detector 124 starts to change from the logic HIGH voltage (such as the voltage VDDL) towards the logic LOW voltage (such as the voltage VSS). In response to the output of the asymmetry lower threshold detector 124 reaching the logic LOW voltage (such as the voltage VSS), the NMOS transistor MN1 is driven into the non-conducting state, and consequently the second switch 132 is driven into the disconnected state. Here, the logic LOW voltage (such as the voltage VSS) of the lower-branch enabling signal ENDN at the output of the asymmetry lower threshold detector 124 is logic FALSE for the purpose of controlling the second switch 132.

From time t1 to time t2, as shown in FIG. 2F, the buffer output node BufOut is still at voltage VSS, even the first switch 131 is at the disconnected state and the second switch 132 is changed from the connected state to the disconnected state after some delay from time t1. The voltage at buffer output node BufOut is maintained by the regenerative circuit 135, even both the first switch 131 and the second switch 132 are at the disconnected state before time t2.

At time t2, the tracking-up signal PADUP rises above the upper threshold voltage VTH of the asymmetry upper threshold detector 114, and the output of the asymmetry upper threshold detector 114 starts to change from the logic HIGH voltage (such as the voltage VDDH) towards the logic LOW voltage (such as the voltage VSSH). In response to the output of the asymmetry upper threshold detector 114 reaching the logic LOW voltage (such as the voltage VSSH), the PMOS transistor MP1 is driven into the conducting state, and consequently the first switch 131 is driven into the connected state. Here, the logic LOW voltage (such as the voltage VSSH) of the upper-branch enabling signal ENUPB at the output of the asymmetry upper threshold detector 114 is logic TRUE for the purpose of controlling the first switch 131. Additionally, at time t2 and thereafter, the tracking-down signal PADDN continues to be above the lower threshold voltage VTL of the asymmetry lower threshold detector 124 at least until time t4. In proper operation, the output of the asymmetry lower threshold detector 124 reaches the logic LOW voltage (such as the voltage VSS) before time t2. At time t2 and thereafter, the output of the asymmetry lower threshold detector 124 is maintained at the logic LOW voltage (such as the voltage VSS) at least until time t4, and consequently the second switch 132 is maintained at the disconnected state at least until time t4. Again, the logic LOW voltage (such as the voltage VSS) of the lower-branch enabling signal ENDN at the output of the asymmetry lower threshold detector 124 is logic FALSE for the purpose of controlling the second switch 132.

After some delay from time t2, in response to the output of the asymmetry upper threshold detector 114 reaches the logic LOW voltage (such as the voltage VSSH), the first switch 131 is driven into the connected state, and consequently the voltage at the buffer output node BufOut is changed to the voltage VDDH, while the second switch 132 is maintained at the disconnected state.

From time t2 to time t3, as shown in FIG. 2F, the buffer output node BufOut is at the voltage VDDH, in response to the condition that the first switch 131 is at the connected state after some delay from time t2 and the second switch 132 is at the disconnected state since time t2.

At time t3, the tracking-up signal PADUP falls below the upper threshold voltage VTH of the asymmetry upper threshold detector 114, and the output of the asymmetry upper threshold detector 114 starts to change from the logic LOW voltage (such as the voltage VSSH) towards the logic HIGH voltage (such as the voltage VDDH). After some delay from time t3, in response to the output of the asymmetry upper threshold detector 114 reaching the logic HIGH voltage (such as the voltage VDDH), the PMOS transistor MP1 is driven into the non-conducting state, and consequently the first switch 131 is driven into the disconnected state. Additionally, at time t3 and thereafter, the tracking-down signal PADDN continues to be above the lower threshold voltage VTL of the asymmetry lower threshold detector 124 at least until time t4, and the output of the asymmetry lower threshold detector 124 is maintained at the logic LOW voltage (such as the voltage VSS) at least until time t4. Consequently, the second switch 132 is maintained at the disconnected state from time t3 to at least time t4.

From time t3 to time t4, as shown in FIG. 2F, the buffer output node BufOut is maintained at voltage VDDH, even the first switch 131 is changed from the connected state to the disconnected state after some delay from time t3 and the second switch 132 is at the disconnected state before time t4. The voltage at buffer output node BufOut is maintained by the regenerative circuit 135, even both the first switch 131 and the second switch 132 are at the disconnected state before time t4.

At time t4 and thereafter, the tracking-up signal PADUP continues to be below the upper threshold voltage VTH of the asymmetry upper threshold detector 114. In proper operation, the output of the asymmetry upper threshold detector 114 reaches the logic HIGH voltage (such as the voltage VDDH) before time t4 and is maintained at the logic HIGH voltage (such as the voltage VDDH) thereafter. Consequently, the output of the asymmetry upper threshold detector 114, the PMOS transistor MP1 is maintained at the non-conducting state, and the first switch 131 is maintained at the disconnected state after time t4. Additionally, at time t4, the tracking-down signal PADDN falls below the lower threshold voltage VTL of the asymmetry lower threshold detector 124, and the output of the asymmetry lower threshold detector 124 starts to change from the logic LOW voltage (such as the voltage VSS) towards the logic HIGH voltage (such as the voltage VDDL). In response to the output of the asymmetry lower threshold detector 124 reaching the logic HIGH voltage (such as the voltage VDDL), the NMOS transistor MN1 is driven into the conducting state after some delay from time t4, and consequently the second switch 132 is driven into the connected state.

After time t4, as shown in FIG. 2F, the voltage at the buffer output node BufOut is changed to voltage VSS, in response to the condition that the first switch 131 is maintained at the disconnected state since time t4 and the second switch 132 is changed from the disconnected state to the connected state after some delay from time t4.

In FIG. 2D, the example waveform of the upper-branch enabling signal ENUPB is generated with an asymmetry upper threshold detector 114 in which the PMOS transistors P1$u$-P4$u$ and the NMOS transistor N1$u$ are sufficiently fast as compared with the falling edge of the input voltage signal PAD in FIG. 2A. Specifically, the PMOS transistors P1$u$-P4$u$ and the NMOS transistor N1$u$ are sufficiently fast such that the output of the asymmetry upper threshold detector 114 reaches the logic HIGH voltage (such as the voltage VDDH) before time t4, after the input voltage signal PAD falls below the upper threshold voltage VTH of the asymmetry upper threshold detector 114 at time t3 when the output of the asymmetry upper threshold detector 114 starts to change from the logic LOW voltage (such as the voltage VSSH) towards the logic HIGH voltage (such as the voltage VDDH). In some circumstances, as shown in the example waveform of FIG. 3D, because the transistors in the asymmetry upper threshold detector 114 are too slow, the output of the asymmetry upper threshold detector 114 is unable to reach the logic HIGH voltage (such as the voltage VDDH) at time t4, which causes an undesirable situation such that both the first switch 131 and the second switch 132 are at the connected state.

In FIG. 2E, the example waveform of the lower-branch enabling signal ENDN is generated with an asymmetry lower threshold detector 124 in which the NMOS transistors N1$u$-N4$u$ and the PMOS transistor P1$d$ are sufficiently fast as compared with the rising edge of the input voltage signal PAD in FIG. 2A. Specifically, the NMOS transistors N1$u$-N4$u$ and the PMOS transistor P1$d$ are sufficiently fast such that the output of the asymmetry lower threshold detector 124 reaches towards the logic LOW voltage (such as the voltage VSS) before time t2, after the tracking-down signal PADDN rises above the lower threshold voltage VTL of the asymmetry lower threshold detector 124 at time t1 when the output of the asymmetry lower threshold detector 124 starts to change from the logic HIGH voltage (such as the voltage VDDL) towards the logic LOW voltage (such as the voltage VSS). In some circumstances, as shown in the example waveform of FIG. 3E, because the transistors in the asymmetry lower threshold detector 124 are too slow, the output of the asymmetry lower threshold detector 124 is unable to reach the logic LOW voltage (such as the voltage VSS) at time t2, which causes an undesirable situation such that both the first switch 131 and the second switch 132 are at the connected state.

Figures 3A, 3B, 3C, 3D, 3E, 3F:
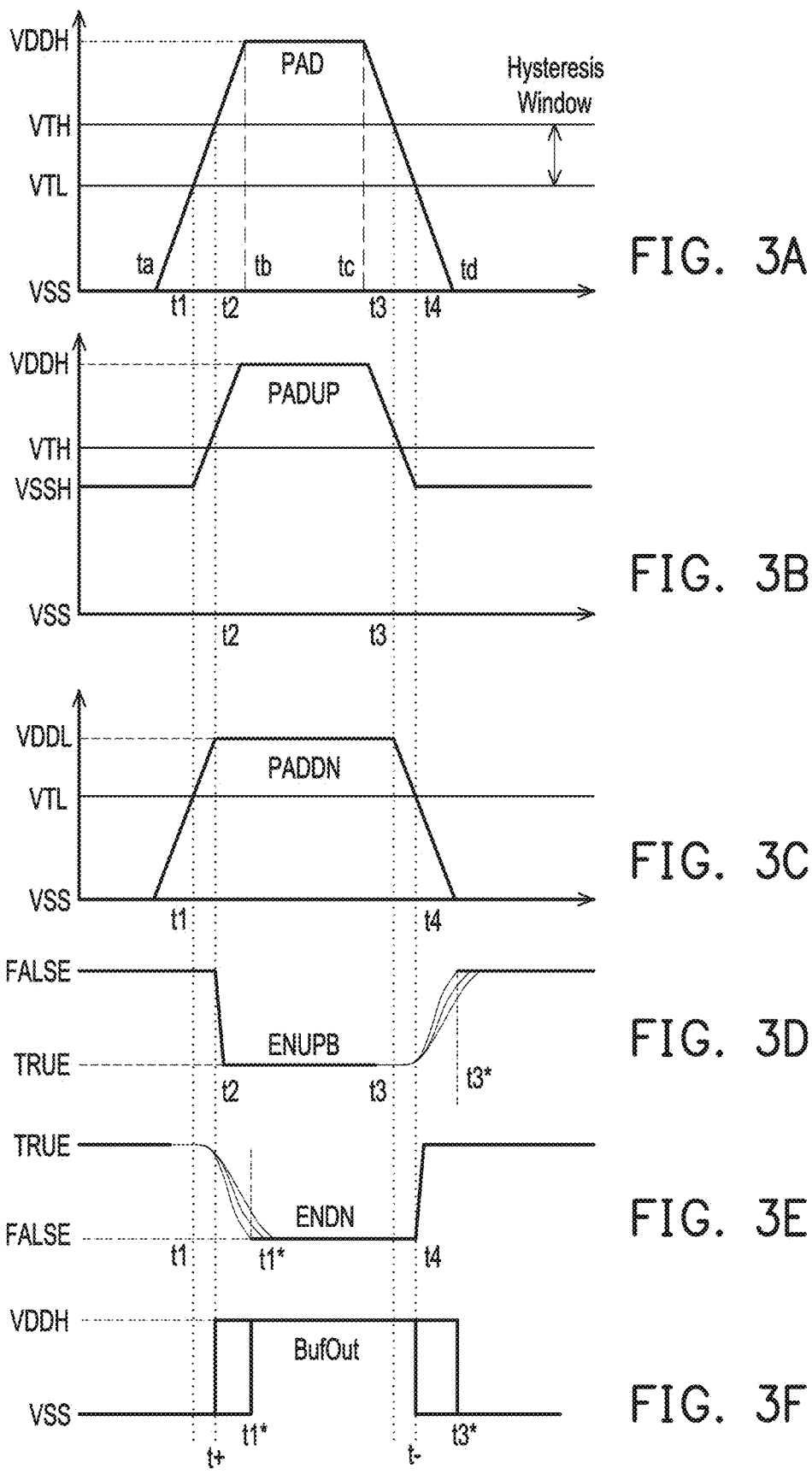
FIGS. 3A-3F are diagrams of waveforms of signals in connection with the input buffer circuit in FIG. 1C, in accordance with some embodiments.

FIGS. 3A-3F are diagrams of waveforms of signals at the input node, the output node, and various other nodes in the input buffer circuit 100C in FIG. 1C, in accordance with some embodiments. FIGS. 3A-3C are correspondingly the same as FIGS. 2A-2C.

FIG. 3D is the waveform of the upper-branch enabling signal ENUPB at the output of the asymmetry upper threshold detector 114 in the input buffer circuit 100C of FIG. 1C. Because the asymmetry upper threshold detector 114 in the input buffer circuit 100C is an asymmetrical threshold detector based on asymmetrical MOSFET thresholds, the falling time of the upper-branch enabling signal ENUPB starting at time t2 to change from the logic HIGH voltage to the logic LOW voltage is smaller than the rising time of the upper-branch enabling signal ENUPB starting at time t3 to change from the logic LOW voltage to HIGH voltage. In some circumstances, as shown in FIG. 3D, the upper-branch enabling signal ENUPB reaches the logic HIGH voltage at time t3*, and the time t3* is later than time t4 (which is the instant the input voltage signal PAD falls below the lower threshold voltage VTL). The slower the transistors in the asymmetry upper threshold detector 114, the larger the time difference t3*–t3. The faster the input voltage signal PAD decreases at the falling edge from the time t3 to time t4, the smaller the time difference t4–t3. In some circumstances, due to a combination of slower transistors and fast signal swings of the input voltage signal PAD, the time difference t3*–t3 is larger than the time difference t4–t3, and consequently the time t3* is later than the time t4.

During the time period from the time t4 to the time t3*, the upper-branch enabling signal ENUPB is at logic TRUE (at the logic LOW voltage) which causes the first switch 131 to be at the connected state, while the lower-branch enabling signal ENDN is also at logic TRUE (at the logic HIGH voltage) which causes the second switch 132 to be at the connected state. In response to the condition that both the first switch 131 and the second switch 132 are at the connected state between the time t4 and the time t3*, malfunctions in the asymmetry upper threshold detector 114 may be induced by a short circuit.

FIG. 3E is the waveform of the lower-branch enabling signal ENDN at the output of the asymmetry lower threshold detector 124 in the input buffer circuit 100C of FIG. 1C. Because the asymmetry lower threshold detector 124 in the input buffer circuit 100C is an asymmetrical threshold detector based on asymmetrical MOSFET thresholds, the falling time of the lower-branch enabling signal ENDN starting at time t1 to change from the logic HIGH voltage to the logic LOW voltage is larger than the rising time of the lower-branch enabling signal ENDN starting at time t4 to change from the logic LOW voltage to the logic HIGH voltage. In some circumstances, as shown in FIG. 3E, the lower-branch enabling signal ENDN reaches the logic LOW voltage at time t1* which is later than time t2 (which is the instant the input voltage signal PAD rises above the upper threshold voltage VTH). The slower the transistors in the asymmetry lower threshold detector 124, the larger the time difference t1*–t1. The faster the input voltage signal PAD increases at the rising edge from the time t1 to time t2, the smaller the time difference t2–t1. In some circumstances, due to a combination of slower transistors and fast signal swings of the input voltage signal PAD, the time difference t1*–t1 is larger than the time difference t2–t1, and consequently the time t1* is later than the time t2.

During the time period from the time t2 to the time t1*, the lower-branch enabling signal ENDN is at logic TRUE (at the logic HIGH voltage) which causes the second switch 132 to be at the connected state, while the upper-branch enabling signal ENUPB is also at logic TRUE (at the logic LOW voltage) which causes the first switch 131 to be at the connected state. In response to the condition that both the first switch 131 and the second switch 132 are at the connected state between the time t2 and the time t1*, malfunctions in the asymmetry lower threshold detector 124 may be induced by a short circuit.

FIG. 3F is the waveform of the voltage at the buffer output node BufOut in the input buffer circuit 100C of FIG. 1C. In FIG. 3F, the asymmetry lower threshold detector 124 risks malfunctions from time t+ to the time t1*, and the asymmetry upper threshold detector 114 risks malfunctions from the time t– and the time t3*. The risks of malfunctions in the asymmetry upper threshold detector 114 and in the asymmetry lower threshold detector 124 due to fast signal swings of the input voltage signal PAD are reduced with improved input buffer circuits, such as the input buffer circuits 400A-400B in FIGS. 4A-4B.

An integrated circuit often has multiple instances of the input buffer circuits, and consequentially an integrated circuit often has multiple instances of the asymmetry upper threshold detector and multiple instances of lower threshold detectors. Because of process, voltage, and temperature variations ("PVT variations") and changes in reliability degradation tolerances, the time t3* associated with each instance of the asymmetry upper threshold detector 114 and the time t1* associated with each instance of the asymmetry lower threshold detector 124 all have variations according to some statistical distributions. The statistical distribution of the time t3* corresponds to a time spread of the time t3*, which is depicted as multiple traces between time t3 and t3* in FIG. 3D. The statistical distribution of the time t1* corresponds to a time spread of the time t1*, which is depicted as multiple traces between time t1 and t1* in FIG. 3E.

The larger PVT variations, the larger the time spread of the time t3*. The larger the time spread of the time t3*, the larger the number of instances of the asymmetry upper threshold detector 114 that risks malfunctions because of the undesirable positive time delay t3*–t4>0. The risk of malfunctions between time t4 and time t3* also increases as the operating frequency of the integrated circuit increases. Similarity, The larger PVT variations, the larger the time spread of the time t1*. The larger the time spread of the time t1*, the larger the number of instances of the asymmetry lower threshold detector 124 that risks malfunctions because of the undesirable positive time delay t1*–t2>0. The risk of malfunctions between time t2 and time t1* also increases as the operating frequency of the integrated circuit increases. For high-speed operations of an integrated circuit which has multiple instances of the input buffer circuits, the input buffer circuits 400A-400B in FIGS. 4A-4B provide improved reliability and reduced malfunctions as compared with the input buffer circuit 100C in FIG. 1C.

Figure 4A:
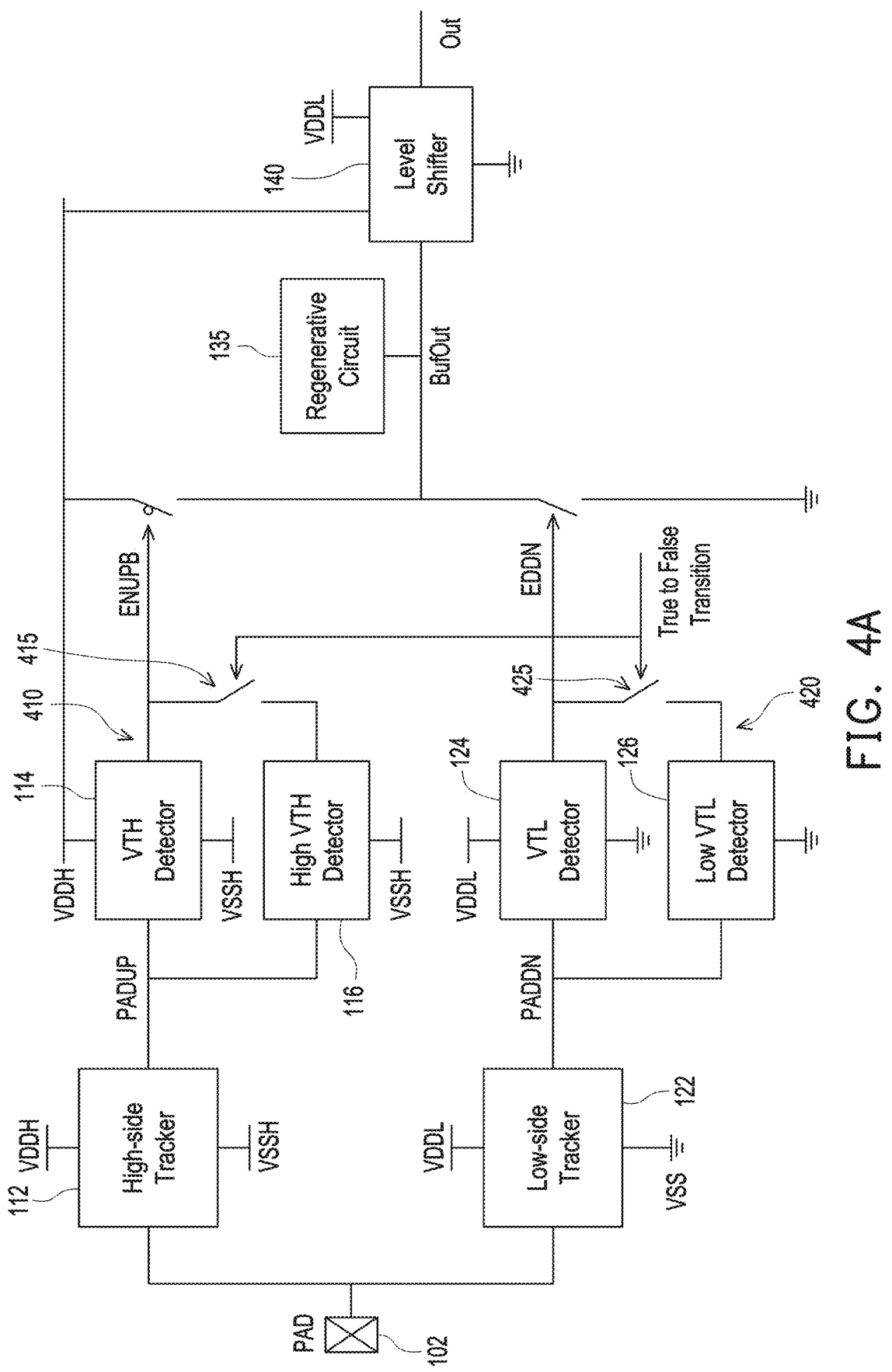
FIGS. 4A-4B are schematic diagrams of input buffer circuits having variable thresholds in threshold circuits, in accordance with some embodiments.
Figure 4B:
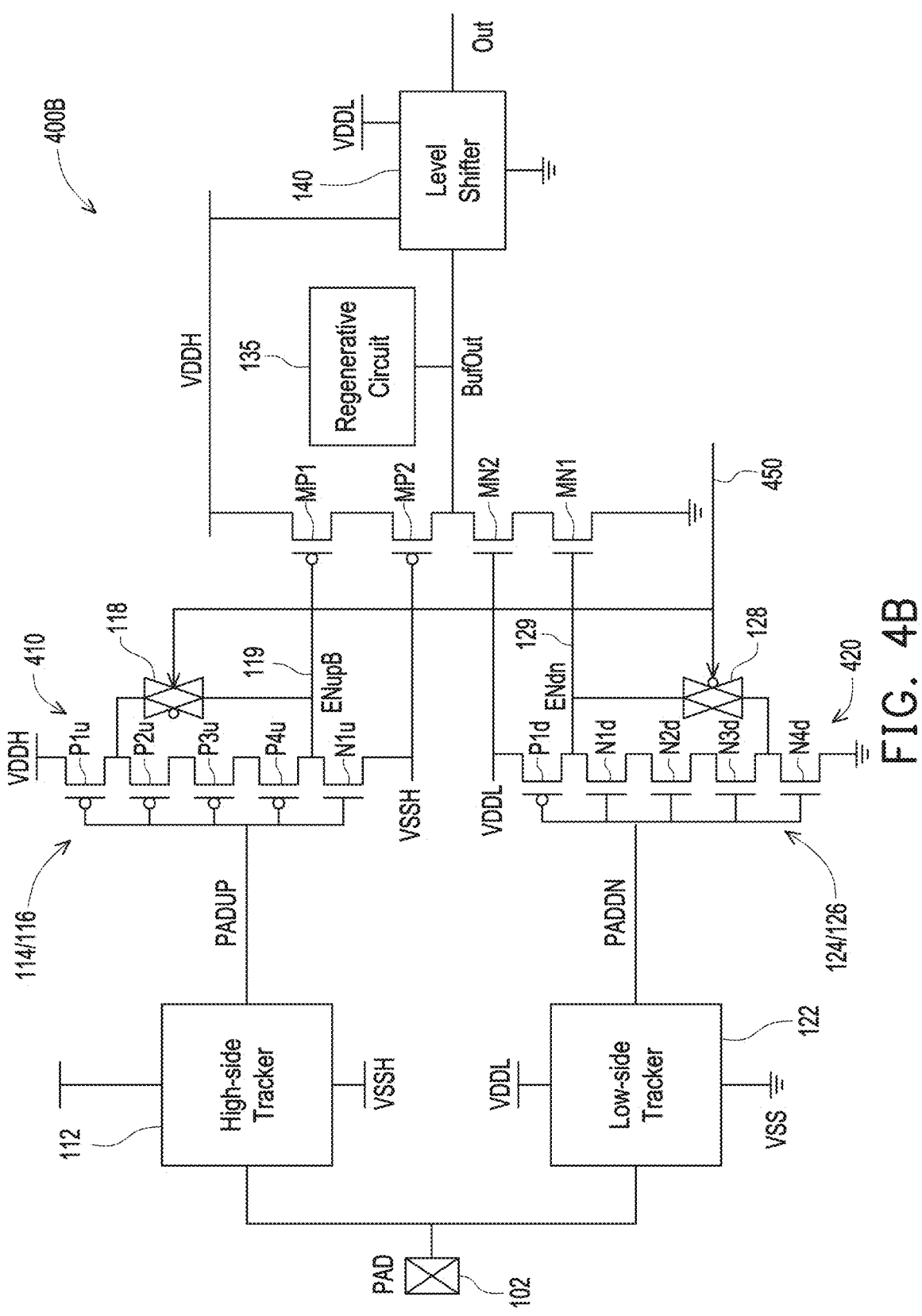

FIGS. 4A-4B are schematic diagrams of input buffer circuits having variable thresholds in threshold circuits, in accordance with some embodiments. Each of the input buffer circuits 400A-400B in FIGS. 4A-4B includes an asymmetry upper threshold circuit 410 and an asymmetry lower threshold circuit 420 both configured to receive a threshold-selection signal 450. Based on the threshold-selection signal 450 received by the asymmetry upper threshold circuit 410, the asymmetry upper threshold circuit 410 is configured to operate either as the asymmetry upper threshold detector 114 or as a supplementary upper threshold detector 116. In response to the threshold-selection signal 450 indicating that the input voltage signal PAD increases at the rising edge, the asymmetry upper threshold circuit 410 operates as the asymmetry upper threshold detector 114 with the main upper threshold VTH. Conversely, In response to the threshold-selection signal 450 indicating that the input voltage signal PAD decreases at the falling edge, the asymmetry upper threshold circuit 410 operates as the supplementary upper threshold detector 116 with the supplementary upper threshold VTH+. The supplementary upper threshold VTH+ is higher than the main upper threshold VTH.

Based on the threshold-selection signal 450 received by the asymmetry lower threshold circuit 420, the asymmetry lower threshold circuit 420 is configured to operate either as the asymmetry lower threshold detector 124 or as a supplementary lower threshold detector 126. In response to the threshold-selection signal 450 indicating that the input voltage signal PAD decreases at the falling edge, the asymmetry lower threshold circuit 420 operates as the asymmetry lower threshold detector 124 with the main lower threshold VTL. Conversely, In response to the threshold-selection signal 450 indicating that the input voltage signal PAD increases at the rising edge, the asymmetry lower threshold circuit 420 operates as the supplementary lower threshold detector 126 with the supplementary lower threshold VTL–. The supplementary lower threshold VTL– is lower than the main lower threshold VTL.

Figures 5A, 5B, 5C, 5D, 5E, 5F:
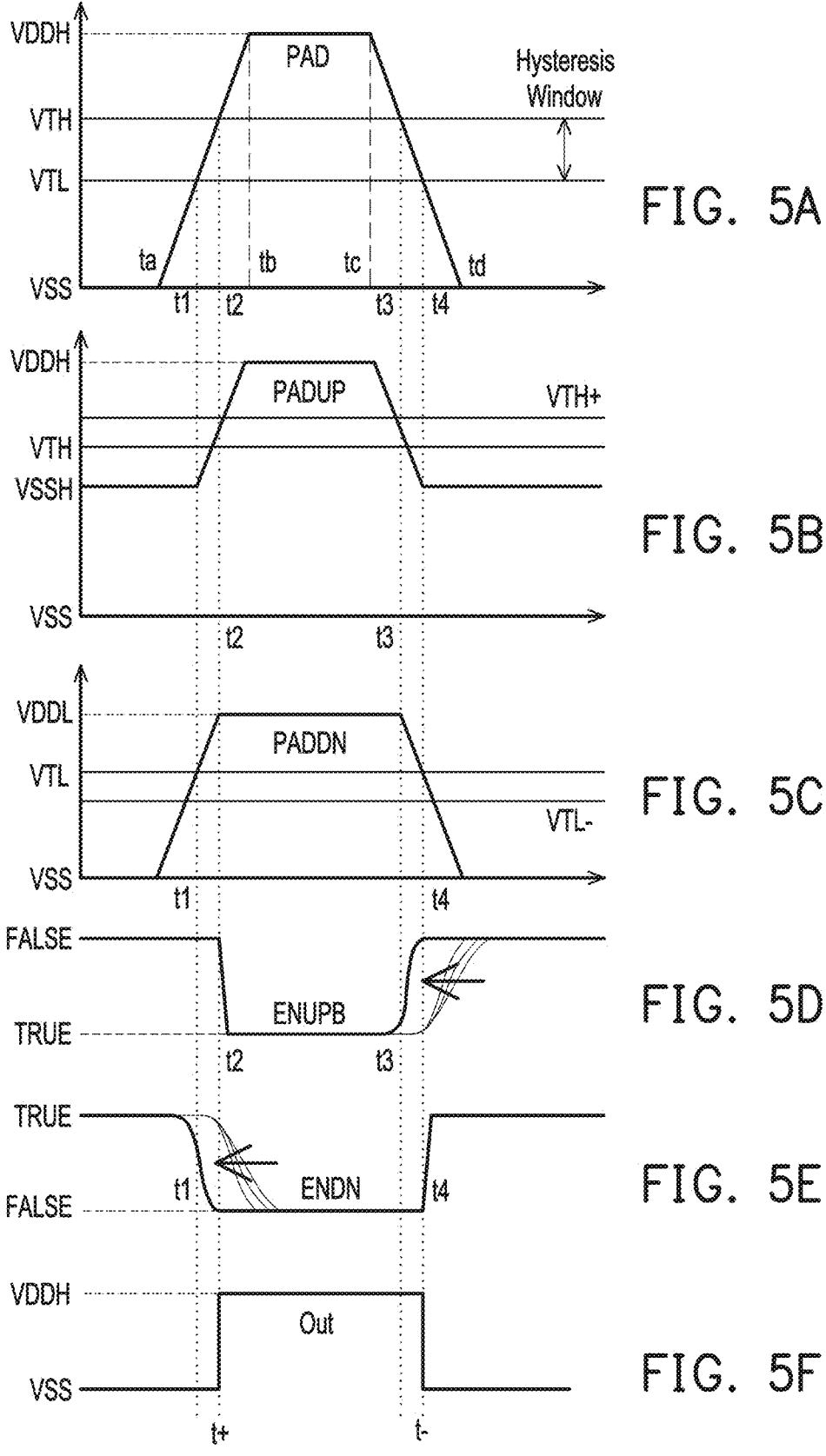
FIGS. 5A-5F are diagrams of waveforms of signals at various nodes of an improved input buffer circuit, in accordance with some embodiments.

FIGS. 5A-5F are diagrams of waveforms of signals at the input node, the output node, and various other nodes in an improved input buffer circuit (such as the input buffer circuit 400A or 400B in FIGS. 4A-4B), in accordance with some embodiments. FIG. 5A is the waveform of the input voltage signal PAD at the input node 102. FIG. 5B is the waveform of the tracking-up signal PADUP at the output of the high-side tracker 112. FIG. 5C is the waveform of the tracking-down signal PADDN at the output of the low-side tracker 122. FIG. 5D is the waveform of the upper-branch enabling signal ENUPB at the output of the asymmetry upper threshold circuit 410. FIG. 5E is the waveform of the lower-branch enabling signal ENDN at the output of the asymmetry lower threshold circuit 420. FIG. 5F is the waveform of the voltage at the buffer output node BufOut. While FIG. 5A and FIG. 5F are correspondingly the same as FIG. 2A and FIG. 2F, FIGS. 5B-5E are correspondingly modified from FIGS. 3B-3E.

As the input voltage signal PAD in FIG. 5A increases at the rising edge from time ta to time tb, the asymmetry upper threshold circuit 410 operates as the asymmetry upper threshold detector 114 with the main upper threshold VTH, and the asymmetry lower threshold circuit 420 operates as the supplementary lower threshold detector 126 with the supplementary lower threshold VTL–. In response to the tracking-down signal PADDN in FIG. 5C rising across the supplementary lower threshold VTL– before t1, the lower-branch enabling signal ENDN (in FIG. 5E) at the output of the asymmetry lower threshold circuit 420 starts to change from the logic HIGH voltage towards the logic LOW voltage. The lower-branch enabling signal ENDN reaches the logic LOW voltage before time t2. Here, time t2 is the instant when the tracking-up signal PADUP in FIG. 5B rises across the main upper threshold VTH. That is, time t2 is the instant when the upper-branch enabling signal ENUPB (in FIG. 5D) at the output of the asymmetry upper threshold circuit 410 starts to change from the logic HIGH voltage towards the logic LOW voltage.

In FIG. 5E, after the tracking-down signal PADDN (in FIG. 5C) rises across the supplementary lower threshold VTL– before time t1, the lower-branch enabling signal ENDN reaches the logic LOW voltage before time t2, because the asymmetry lower threshold circuit 420 operates as the supplementary lower threshold detector 126 with the supplementary lower threshold VTL–. As a comparison, in FIG. 3E, after the tracking-down signal PADDN (in FIG. 3C) rises across the lower threshold VTL at time t1, the lower-branch enabling signal ENDN in the input buffer circuit 100C of FIG. 1C reaches the logic LOW voltage at time t1* which is later than time t2. Unlike the input buffer circuit 100C of FIG. 1C which has the risk of circuit malfunctions between time t2 and time t1*, the improved input buffer circuit (such as the input buffer circuit 400A or 400B in FIGS. 5A-4B) reduces the risk of circuit malfunctions after time t2, because the lower-branch enabling signal ENDN reaches the logic LOW voltage before time t2. The time spread of the time t1* after time t2 is suppressed, as shown by the arrow pointing towards the TRUE-to-FALSE falling edge near time t1 in FIG. 5E.

As the input voltage signal PAD in FIG. 5A decreases at the falling edge from time tc to time td, the asymmetry upper threshold circuit 410 operates as the supplementary upper threshold detector 116 with the supplementary upper threshold VTH+, and the asymmetry lower threshold circuit 420 operates as the asymmetry lower threshold detector 124 with the main lower threshold VTL. In response to the tracking-up signal PADUP in FIG. 5B falling across the supplementary upper threshold VTH+, the upper-branch enabling signal ENUPB (in FIG. 5D) at the output of the asymmetry upper threshold circuit 410 starts to change from the logic LOW voltage towards the logic HIGH voltage. The upper-branch enabling signal ENUPB reaches the logic HIGH voltage before time t4. Here, time t4 is the instant when the tracking-down signal PADDN in FIG. 5C falls across the main lower threshold VTL. That is, time t4 is the instant when the lower-branch enabling signal ENDN (in FIG. 5E) at the output of the asymmetry lower threshold circuit 420 starts to change from the logic LOW voltage towards the logic HIGH voltage.

In FIG. 5D, after the tracking-up signal PADUP in FIG. 5B falls across the supplementary upper threshold VTH+ before time t3, the upper-branch enabling signal ENUPB (in FIG. 5D) reaches the logic HIGH voltage before time t4, because the asymmetry upper threshold circuit 410 operates as the supplementary upper threshold detector 116 with the supplementary upper threshold VTH+. As a comparison, in FIG. 3D, after the tracking-up signal PADUP in FIG. 3B falls across the upper threshold VTH at time t3, the upper-branch enabling signal ENUPB in the input buffer circuit 100C of FIG. 1C reaches the logic HIGH voltage at time t3\* which is later than time t4. Unlike the input buffer circuit 100C of FIG. 1C which has the risk of circuit malfunctions between time t4 and time t3\*, the improved input buffer circuit (such as the input buffer circuit 400A or 400B in FIGS. 4A-4B) removed the risk of circuit malfunctions after time t4, because the upper-branch enabling signal ENUPB reaches the logic HIGH voltage before time t4. The time spread of the time t3\* after time t4 is suppressed, as shown by the arrow pointing towards the TRUE-to-FALSE rising edge near time t3 in FIG. 5D.

The input buffer circuit 400B in FIG. 4B, which provides an example implementation of the input buffer circuit 400A in FIG. 4A, is modified from the input buffer circuit 100C of FIG. 1C. Based on the input buffer circuit 100C of FIG. 1C, a transmission gate 118 and a transmission gate 128 are added as the elements of the input buffer circuit 400B.

In FIG. 4B, the input buffer circuit 400B includes an asymmetry upper threshold circuit 410 and an asymmetry lower threshold circuit 420. The asymmetry upper threshold circuit 410 in FIG. 4B, which is modified from the asymmetry upper threshold detector 114 in FIG. 1C, includes a transmission gate 118 connected between the drain terminal of the PMOS transistor P1*u* and the drain terminal of the NMOS transistor N1*u*. The asymmetry lower threshold circuit 420 in FIG. 4B, which is modified from the asymmetry lower threshold detector 124 in FIG. 1C, includes a transmission gate 128 connected between the drain terminal of the PMOS transistor P1*d* and the drain terminal of the NMOS transistor N4*d*.

In operation, each of the transmission gate 118 and the transmission gate 128 is controlled with the threshold-selection signal 450. The operation mode of the asymmetry upper threshold circuit 410 and the operation mode of the asymmetry lower threshold circuit 420 depend upon the threshold-selection signal 450 received.

In response to the threshold-selection signal 450 indicating that the input voltage signal PAD increases at the rising edge, the transmission gate 118 is set to the non-transmission state which blocks the direct conductive connection between the drain terminal of the PMOS transistor P1*u* and the drain terminal of the NMOS transistor N1*u*, and the transmission gate 128 is set to the transmission state which forms the direct conductive connection between the drain terminal of the PMOS transistor P1*d* and the drain terminal of the NMOS transistor N4*d*. Consequently, at the rising edge of the input voltage signal PAD, the asymmetry upper threshold circuit 410 operates as the asymmetry upper threshold detector 114 with the main upper threshold VTH, and the asymmetry lower threshold circuit 420 operates as the supplementary lower threshold detector 126 with the supplementary lower threshold VTL−.

In response to the threshold-selection signal 450 indicating that the input voltage signal PAD decreases at the falling edge, the transmission gate 118 is set to the transmission state which forms the direct conductive connection between the drain terminal of the PMOS transistor P1*u* and the drain terminal of the NMOS transistor N1*u*, and the transmission gate 128 is set to the non-transmission state which blocks the direct conductive connection between the drain terminal of the PMOS transistor P1*d* and the drain terminal of the NMOS transistor N4*d*. Consequently, at the falling edge of the input voltage signal PAD, the asymmetry upper threshold circuit 410 operates as the supplementary upper threshold detector 116 with the supplementary upper threshold VTH+, and the asymmetry lower threshold circuit 420 operates as the asymmetry lower threshold detector 124 with the main lower threshold VTL.

In the input buffer circuit 400B in FIG. 4B, the transmission gate 118 and the transmission gate 128 are both controlled with the threshold-selection signal 450. In some alternative embodiments, the transmission gate 118 and the transmission gate 128 are controlled with two separate and related threshold-selection signals. In some embodiments, threshold-selection signal 450 or other related threshold-selection signals are generated based on the voltage signal at the buffer output node BufOut of the input buffer circuit. One example method of generating threshold-selection signals is disclosed with respect to FIG. 6.

Figure 6:
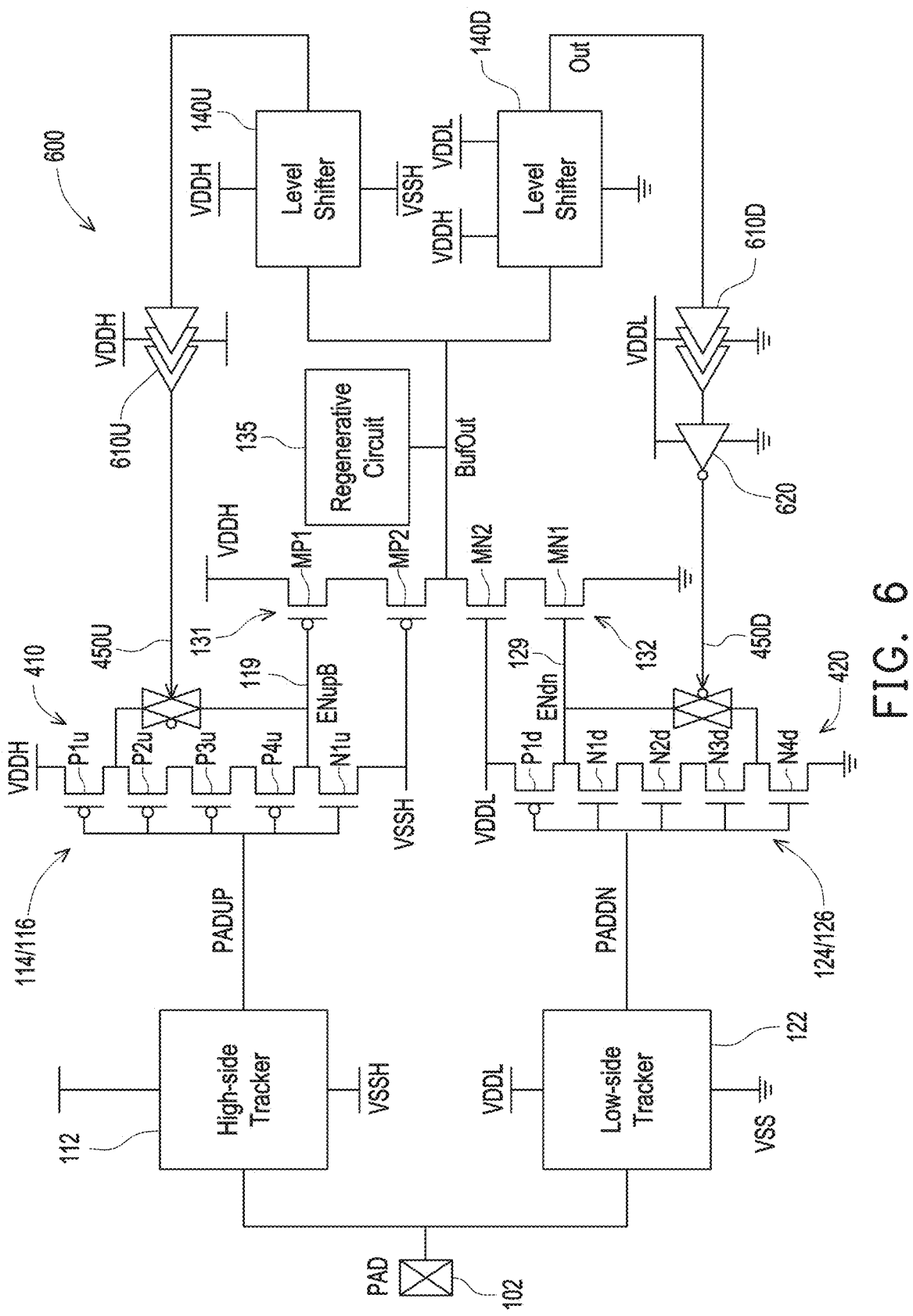
FIG. 6 is a schematic diagram of an input buffer circuit which has threshold circuits controlled with threshold-selection signals, in accordance with some embodiments.

FIG. 6 is a schematic diagram of an input buffer circuit 600 which has threshold circuits controlled with threshold-selection signals, in accordance with some embodiments. The input buffer circuit 600 in FIG. 6 is modified from the input buffer circuit 400B in FIG. 4B. In FIG. 6, threshold-selection signals 450U and 450D replace the threshold-selection signal 450 in FIG. 4B and correspondingly control the transmission gates 118 and 128. Level shifters 140U and 140D replace the level shifter 140 in FIG. 4B. Delay circuits 610U and 610D and an inverter 620 are added. The delay circuit 610U is coupled between the level shifter 140U and the transmission gate 118. The delay circuit 610D and the inverter 620 are coupled between the level shifter 140D and the transmission gate 128.

In operation, the controlling of the transmission gates 118 and 128 is based on the voltage signal at the buffer output node BufOut of the input buffer circuit. As shown in FIG. 5A and FIG. 5F, before the input voltage signal PAD increases at the rising edge, the voltage signal at the buffer output node BufOut is at logic LOW. The threshold-selection signal 450U is set to logic FALSE, which is induced by the voltage signal at the buffer output node BufOut through the delay circuit 610U. The threshold-selection signal 450D is set to logic TRUE, which is induced by the voltage signal at the buffer output node BufOut through the delay circuit 610D and the inverter 620. In response to the threshold-selection signal 450U being at logic FALSE, the transmission gate 118 is set to the non-transmission state. In response to the threshold-selection signal 450D being at logic TRUE, the transmission gate 128 is set to the transmission state.

Furthermore, as shown in FIG. 5A and FIG. 5F, before the input voltage signal PAD decreases at the falling edge, the voltage signal at the buffer output node BufOut is at logic HIGH. The threshold-selection signal 450U is set to logic TRUE, which is induced by the voltage signal at the buffer output node BufOut through the delay circuit 610U. The threshold-selection signal 450D is set to logic FALSE, which is induced by the voltage signal at the buffer output node BufOut through the delay circuit 610D and the inverter 620. In response to the threshold-selection signal 450U being at logic TRUE, the transmission gate 118 is set to the transmission state. In response to the threshold-selection signal 450D being at logic FALSE, the transmission gate 128 is set to the non-transmission state. In FIG. 6, the threshold-selection signal 450U is generated by a first threshold-selection signal circuit having the delay circuit 610U, and the threshold-selection signal 450D is generated by a second threshold-selection signal circuit having the delay circuit 610D and the inverter 620.

In the embodiments of FIG. 4B and FIG. 6, each of the transmission gates 118 and 128 functions as a liner switch. In some alternative embodiments, either one of the transmission gates 118 and 128 or both of the transmission gates 118 and 128 are replaced with other forms of linear switches.

FIG. 7 is a flowchart of method 700 of generating an output voltage signal from an input voltage signal, in accordance with some embodiments. The sequence in which the operations of method 700 are depicted in FIG. 7 is for illustration only; the operations of method 700 are capable of being executed in sequences that differ from that depicted in FIG. 7. It is understood that additional operations may be performed before, during, and/or after the method 700 depicted in FIG. 7, and that some other processes may only be briefly described herein. The operations of the method 700 are described by referring to the waveforms in FIG. 5A-5F and the input buffer circuit 400B in FIG. 4B.

In operation 705 of method 700, the input buffer circuit determines whether the input voltage signal PAD is rising or falling. If the input voltage signal PAD is rising, the process proceeds to operation 710. If the input voltage signal PAD is falling, the process proceeds to operation 720.

In operation 710, in response to the input voltage signal PAD rising across a supplementary lower threshold VTL− (as shown in FIG. 5C), the input buffer circuit changes the lower-branch enabling signal from logic TRUE to logic FALSE (as shown in FIG. 5E). In the embodiments of FIG. 4B, for the lower-branch enabling signal ENDN, logic TRUE is represented with the logic HIGH voltage (such as the voltage VDDL), and logic FALSE is represented with the logic LOW voltage (such as the voltage VSS).

Then, in operation 714 following operation 710, the second switch 132 is driven into the disconnected state. In the embodiments of FIG. 4B, the logic LOW voltage (such as the voltage VSS) is applied to the gate terminal of the NMOS transistor MN1, which drives the second switch 132 into the disconnected state.

In operation 730, in response to the input voltage signal PAD rising across a main upper threshold VTH (as shown in FIG. 5B), the input buffer circuit changes the upper-branch enabling signal from logic FALSE to logic TRUE (as shown in FIG. 5D). In the embodiments of FIG. 4B, for the upper-branch enabling signal ENUPB, logic TRUE is represented with the logic LOW voltage (such as the voltage VSSH), and logic FALSE is represented with the logic HIGH voltage (such as the voltage VDDH).

Then, in operation 734 following operation 730, the first switch 131 is driven into the connected state. In the embodiments of FIG. 4B, the logic LOW voltage (such as the voltage VSSH) is applied to the gate terminal of the PMOS transistor MP1, which drives the first switch 131 into the connected state. After operation 734, the process proceeds to operation 705.

In the event that, in operation 705, the input buffer circuit determines that the input voltage signal PAD is falling, then, the process proceeds to operation 720. In operation 720, in response to the input voltage signal PAD falling across a supplementary upper threshold VTH+ (as shown in FIG. 5B), the input buffer circuit changes the upper-branch enabling signal from logic TRUE to logic FALSE (as shown in FIG. 5D). In the embodiments of FIG. 4B, for the upper-branch enabling signal ENUPB, logic TRUE is represented with the logic LOW voltage (such as the voltage VSSH), and logic FALSE is represented with the logic HIGH voltage (such as the voltage VDDH).

Then, in operation 724 following operation 720, the first switch 131 is driven into the disconnected state. In the embodiments of FIG. 4B, the logic HIGH voltage (such as the voltage VDDH) is applied to the gate terminal of the PMOS transistor MP1, which drives the first switch 131 into the disconnected state.

In operation 740, in response to the input voltage signal PAD falling across a main lower threshold VTL (as shown in FIG. 5C), the input buffer circuit changes the lower-branch enabling signal from logic FALSE to logic TRUE (as shown in FIG. 5E). In the embodiments of FIG. 4B, for the lower-branch enabling signal ENDN, logic TRUE is represented with the logic HIGH voltage (such as the voltage VDDL), and logic FALSE is represented with the logic LOW voltage (such as the voltage VSS).

Then, in operation 744 following operation 740, the second switch 132 is driven into the connected state. In the embodiments of FIG. 4B, the logic HIGH voltage (such as the voltage VDDL) is applied to the gate terminal of the NMOS transistor MN1, which drives the second switch 132 into the connected state.

In the example embodiments as shown in FIG. 1C, FIG. 4B, and FIG. 6, the asymmetry upper threshold detector 114 includes four PMOS transistors P1*u*-P4*u* stacked together and a NMOS transistor N1*u*, and the asymmetry lower threshold detector 124 includes four NMOS transistors N1*d*-N4*d* stacked together and a PMOS transistor P1*d*. In some alternative embodiments, the asymmetry upper threshold detector 114 includes less than four PMOS transistors or more than four PMOS transistors. In some alternative embodiments, the asymmetry lower threshold detector 124 includes less than four NMOS transistors or more than four NMOS transistors. Implementations of the asymmetry upper threshold detector 114 with multiple stacked PMOS transistors other than stacked four PMOS transistors are within the contemplated scope of present disclosure. Implementations of the asymmetry lower threshold detector 124 with multiple stacked NMOS transistors other than four stacked NMOS transistors are also within the contemplated scope of present disclosure.

In some embodiments, in the asymmetry upper threshold detector 114, each of the four PMOS transistors P1*u*-P4*u* is a standard threshold transistor. In some alternative embodiments, the PMOS transistor P1*u* is a low threshold transistor, while the remaining three PMOS transistors P2*u*-P4*u* are standard threshold transistors. In still some alternative embodiments, the four stacked PMOS transistors P1*u*-P4*u* in the asymmetry upper threshold detector 114 are substituted with multiple stacked PMOS transistors P1$u$, P2$u$, . . . , and Pku, where k is an integer that is larger than two. Among the multiple stacked PMOS transistors, the PMOS transistor P1$u$ is a low threshold transistor, while the remaining (k-1) PMOS transistors P2$u$-Pku are standard threshold transistors. As the PMOS transistor P1$u$ is changed from a standard threshold transistor to a low threshold transistor, the upper-branch enabling signal ENUPB at the output of the asymmetry upper threshold detector 114 has an improved transition speed from logic TRUE to logic FALSE. Some other embodiments of the asymmetry upper threshold detector 114 are described with respect to FIG. 8A.

In some embodiments, in the asymmetry lower threshold detector 124, each of the four NMOS transistors N1$d$-N4$d$ is a standard threshold transistor. In some alternative embodiments, the NMOS transistor N4$d$ is a low threshold transistor, while the remaining three NMOS transistors N1$d$-N3$d$ are standard threshold transistors. In still some alternative embodiments, the four stacked NMOS transistors N1$d$-N4$d$ in the asymmetry lower threshold detector 124 are substituted with multiple stacked NMOS transistors N1$d$, N2$d$, . . . , and Nkd, where k is an integer that is larger than two. Among the multiple stacked NMOS transistors, the NMOS transistor Nkd is a low threshold transistor, while the remaining (k-1) NMOS transistors N1$d$, N2$d$, . . . , and N(k-1)$d$ are standard threshold transistors. As the NMOS transistor Nkd is changed from a standard threshold transistor to a low threshold transistor, the lower-branch enabling signal ENDN at the output of the asymmetry lower threshold detector 124 has an improved transition speed from logic TRUE to logic FALSE. Some other embodiments of the asymmetry lower threshold detector 124 are described with respect to FIG. 8B.

Figure 8A:
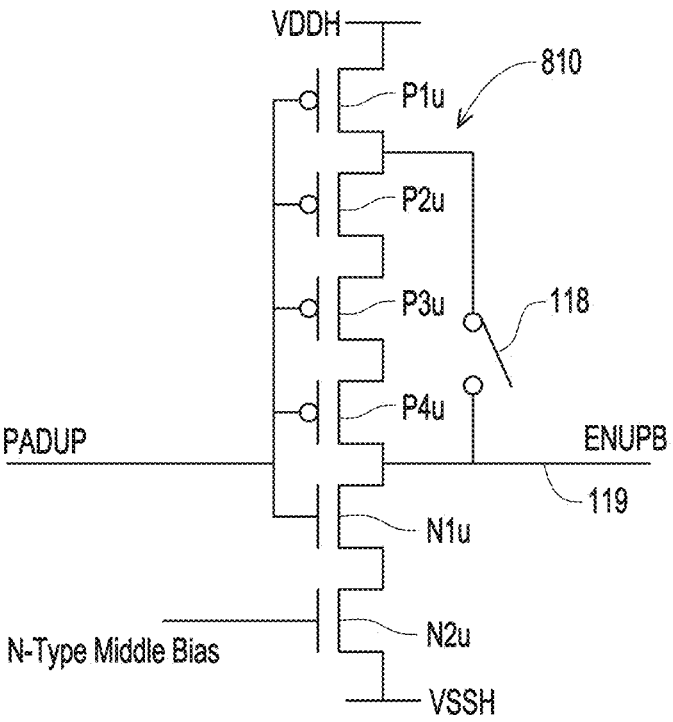
FIG. 8A is a schematic diagram of an asymmetry upper threshold circuit, in accordance with some embodiments.

FIG. 8A is a schematic diagram of an asymmetry upper threshold circuit, in accordance with some embodiments. The asymmetry upper threshold detector in the asymmetry upper threshold circuit 810 of FIG. 8A is modified from the asymmetry upper threshold detector in the asymmetry upper threshold circuit 410 of FIG. 4B. The modification includes connecting the channel of an NMOS transistor N2$u$ between the source terminal of the NMOS transistor N1$u$ and the power supply voltages VSSH. The gate terminal of the NMOS transistor N2$u$ is biased at an N-type "Middle Bias" voltage, whereby causing the NMOS transistor N2$u$ to function as a resistive element. The asymmetry upper threshold detector in the asymmetry upper threshold circuit 810 of FIG. 8A has an upper threshold voltage VTH+ΔVu, which is larger than the upper threshold voltage VTH of the asymmetry upper threshold detector in the asymmetry upper threshold circuit 410 of FIG. 4B by a positive amount of ΔVu.

Figure 8B:
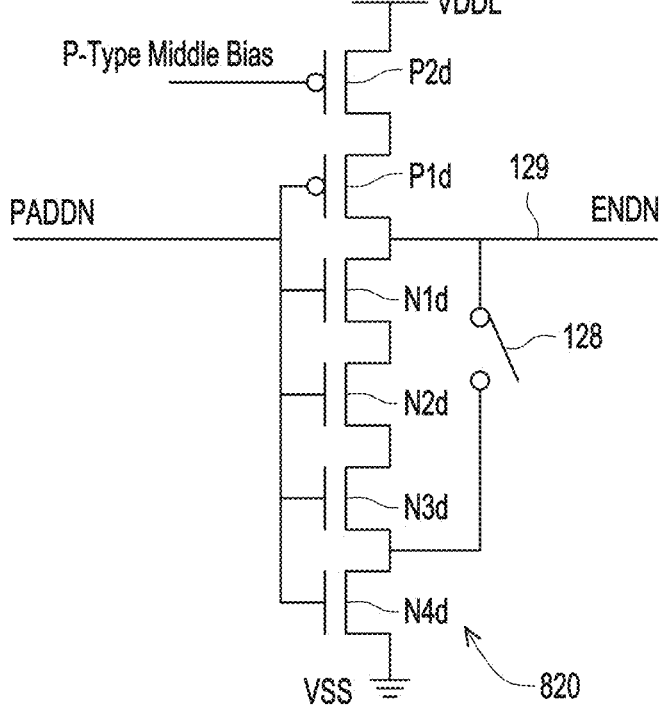
FIG. 8B is a schematic diagram of an asymmetry lower threshold circuit, in accordance with some embodiments.

FIG. 8B is a schematic diagram of an asymmetry lower threshold circuit, in accordance with some embodiments. The asymmetry lower threshold detector in the asymmetry lower threshold circuit 820 of FIG. 8B is modified from the asymmetry lower threshold detector in the asymmetry lower threshold circuit 420 of FIG. 4B. The modification includes connecting the channel of a PMOS transistor P2$d$ between the source terminal of the PMOS transistor P1$d$ and the power supply voltages VDDL. The gate terminal of the PMOS transistor P2$d$ is biased at a P-type "Middle Bias" voltage, whereby causing the PMOS transistor P2$d$ to function as a resistive element. The asymmetry lower threshold detector in the asymmetry lower threshold circuit 820 of FIG. 8B has a lower threshold voltage VTL-ΔVd, which is smaller than the lower threshold voltage VTL of the asymmetry lower threshold detector in the asymmetry lower threshold circuit 420 of FIG. 4B by a positive amount of ΔVd.

In some embodiments, the input buffer circuit 400B of FIG. 4B is modified to obtain an improved input buffer circuit. The modification includes replacing the asymmetry upper threshold circuit 410 of FIG. 4B with the asymmetry upper threshold circuit 810 of FIG. 8A and replacing the asymmetry lower threshold circuit 420 of FIG. 4B with the asymmetry lower threshold circuit 820 of FIG. 8B. After the modification, the improved input buffer circuit has an enlarged hysteresis window (VTH+ΔVu)-(VTL-ΔVd), which is a positive amount of ΔVu+ΔVd.

An aspect of the present disclosure relates to an integrated circuit. The integrated circuit includes an asymmetry upper threshold circuit having an upper-branch output node configured to output an upper-branch enabling signal generated from an input voltage signal, an asymmetry lower threshold circuit having a lower-branch output node configured to output a lower-branch enabling signal generated from the input voltage signal, and a control circuit configured to change an output voltage signal from a first voltage level to a second voltage level in response to a condition that a logic level of the upper-branch enabling signal and a logic level of the lower-branch enabling signal are changed consecutively. The asymmetry upper threshold circuit is configured to set the upper-branch enabling signal to a first upper-branch logic level in response to the input voltage signal rising across a main upper threshold, and configured to set the upper-branch enabling signal to a second upper-branch logic level in response to the input voltage signal falling across a supplementary upper threshold. The supplementary upper threshold is higher than the main upper threshold. The asymmetry lower threshold circuit is configured to set the lower-branch enabling signal to a first lower-branch logic level in response to the input voltage signal falling across a main lower threshold, and configured to set the lower-branch enabling signal to a second lower-branch logic level in response to the input voltage signal rising across a supplementary lower threshold. The supplementary lower threshold is lower than the main lower threshold.

Another aspect of the present disclosure relates to a method. The method includes generating an upper-branch enabling signal based on comparing an input voltage signal with either a main upper threshold or a supplementary upper threshold, generating an lower-branch enabling signal based on comparing the input voltage signal with either a main lower threshold or a supplementary lower threshold, and changing an output voltage signal from a first voltage level to a second voltage level in response to the logic level of the upper-branch enabling signal and the logic level of the lower-branch enabling signal are changed consecutively. Generating the upper-branch enabling signal includes changing a logic level of the upper-branch enabling signal to a first upper-branch logic level in response to the input voltage signal rising across the main upper threshold, and changing the logic level of the upper-branch enabling signal to a second upper-branch logic level in response to the input voltage signal falling across the supplementary upper threshold. The supplementary upper threshold is higher than the main upper threshold. Generating the lower-branch enabling signal includes changing a logic level of the lower-branch enabling signal to a first lower-branch logic level in response to the input voltage signal falling across the main lower threshold, and changing the logic level of the lower-branch enabling signal being set to a second lower-branch logic level in response to the input voltage signal rising across the supplementary lower threshold. The supplementary lower threshold is lower than the main lower threshold.

Another aspect of the present disclosure still relates to an integrated circuit. The integrated circuit includes an asymmetry upper threshold circuit configured to output an upper-branch enabling signal at an upper-branch output node, an asymmetry lower threshold circuit configured to output a lower-branch enabling signal at a lower-branch output node, a first switch configured to be controlled with the upper-branch enabling signal from the upper-branch output node, and a second switch configured to be controlled with the lower-branch enabling signal from the lower-branch output node. Each of the asymmetry upper threshold circuit and the asymmetry lower threshold circuit includes a first-type transistor having a gate terminal configured as an input terminal and having a drain terminal thereof configured as either the upper-branch output node or the lower-branch output node, and a plurality of second-type transistors having channels thereof serially connected between a voltage node and the drain terminal of the first-type transistor. The second-type transistors have gate terminals thereof all connected to the gate terminal of the first-type transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
an asymmetry upper threshold circuit having an upper-branch output node configured to output an upper-branch enabling signal generated from an input voltage signal, wherein the asymmetry upper threshold circuit is configured to set the upper-branch enabling signal to a first upper-branch logic level in response to the input voltage signal rising across a main upper threshold, and configured to set the upper-branch enabling signal to a second upper-branch logic level in response to the input voltage signal falling across a supplementary upper threshold, and wherein the supplementary upper threshold is higher than the main upper threshold;
an asymmetry lower threshold circuit having a lower-branch output node configured to output a lower-branch enabling signal generated from the input voltage signal, wherein the asymmetry lower threshold circuit is configured to set the lower-branch enabling signal to a first lower-branch logic level in response to the input voltage signal falling across a main lower threshold, and configured to set the lower-branch enabling signal to a second lower-branch logic level in response to the input voltage signal rising across a supplementary lower threshold, and wherein the supplementary lower threshold is lower than the main lower threshold; and
a control circuit configured to change an output voltage signal from a first voltage level to a second voltage level in response to a condition that a logic level of the upper-branch enabling signal and a logic level of the lower-branch enabling signal are changed consecutively.

2. The integrated circuit of claim 1, wherein:
the control circuit is configured to change the output voltage signal from the first voltage level to the second voltage level in response to a condition that the logic level of the upper-branch enabling signal is changed after the logic level of the lower-branch enabling signal is changed.

3. The integrated circuit of claim 1, wherein:
the control circuit is configured to change the output voltage signal from the second voltage level to the first voltage level in response to a condition that the logic level of the upper-branch enabling signal is changed before the logic level of the lower-branch enabling signal is changed.

4. The integrated circuit of claim 1, wherein the asymmetry upper threshold circuit comprises:
an NMOS transistor having a drain terminal thereof connected to the upper-branch output node; and
a plurality of PMOS transistors having channels thereof serially connected between a first voltage node and the drain terminal of the NMOS transistor, wherein gate terminals of the NMOS transistor and the PMOS transistors are connected together.

5. The integrated circuit of claim 4, wherein the asymmetry upper threshold circuit further comprises:
a transmission gate connected between the drain terminal of the NMOS transistor and the drain terminal of one of the PMOS transistors, the transmission gate having a conducting state thereof controlled with a threshold-selection signal.

6. The integrated circuit of claim 1, wherein the asymmetry lower threshold circuit comprises:
a PMOS transistor having a drain terminal thereof connected to the lower-branch output node; and
a plurality of NMOS transistors having channels thereof serially connected between a second voltage node and the drain terminal of the PMOS transistor, wherein gate terminals of the PMOS transistor and the NMOS transistors are connected together.

7. The integrated circuit of claim 6, wherein the asymmetry lower threshold circuit further comprises:
a transmission gate connected between the drain terminal of the PMOS transistor and the drain terminal of one of the NMOS transistors, the transmission gate having a conducting state thereof controlled with a threshold-selection signal.

8. The integrated circuit of claim 1, further comprising:
a threshold-selection signal circuit having a delay circuit therein and configured to generate a threshold-selection signal in response to a change of the output voltage signal.

9. The integrated circuit of claim 1, wherein the control circuit comprises:
a first switch configured to be controlled with the upper-branch enabling signal from the upper-branch output node;
a second switch configured to be controlled with the lower-branch enabling signal from the lower-branch output node; and
a buffer output node at an electric connection between the first switch and the second switch.

10. The integrated circuit of claim 9, wherein:
the first switch is electrically connected between a first voltage node and the buffer output node; and
the second switch is electrically connected between the buffer output node and a second voltage node.

11. The integrated circuit of claim 9, further comprising:

a regenerative circuit electrically coupled to the buffer output node and configured to maintain a voltage at the buffer output node during a time period when the first switch is at a disconnected state and the second switch is at a disconnected state.

12. An integrated circuit comprising:

an asymmetry upper threshold circuit having an upper-branch output node configured to output an upper-branch enabling signal generated from an input voltage signal, wherein the asymmetry upper threshold circuit is configured to set the upper-branch enabling signal to a first upper-branch logic level in response to the input voltage signal rising across a main upper threshold, and configured to set the upper-branch enabling signal to a second upper-branch logic level in response to the input voltage signal falling across a supplementary upper threshold, and wherein the supplementary upper threshold is higher than the main upper threshold;

an asymmetry lower threshold circuit having a lower-branch output node configured to output a lower-branch enabling signal generated from the input voltage signal, wherein the asymmetry lower threshold circuit is configured to set the lower-branch enabling signal to a first lower-branch logic level in response to the input voltage signal falling across a main lower threshold, and configured to set the lower-branch enabling signal to a second lower-branch logic level in response to the input voltage signal rising across a supplementary lower threshold, and wherein the supplementary lower threshold is lower than the main lower threshold; and a control circuit configured to change an output voltage signal from a first voltage level to a second voltage level in response to a condition that a logic level of the upper-branch enabling signal and a logic level of the lower-branch enabling signal are changed consecutively, wherein the control circuit includes a buffer output node at an electric connection between a first switch and a second switch.

13. The integrated circuit of claim 12, further comprising:

a threshold-selection signal circuit having a delay circuit therein and configured to generate a threshold-selection signal in response to a change of the output voltage signal.

14. The integrated circuit of claim 12, wherein the control circuit comprises:

the first switch is configured to be controlled with the upper-branch enabling signal from the upper-branch output node; and the second switch is configured to be controlled with the lower-branch enabling signal from the lower-branch output node.

15. The integrated circuit of claim 12, wherein:

the first switch is electrically connected between a first voltage node and the buffer output node; and the second switch is electrically connected between the buffer output node and a second voltage node.

16. The integrated circuit of claim 12, further comprising:

a regenerative circuit electrically coupled to the buffer output node and configured to maintain a voltage at the buffer output node during a time period when the first switch is at a disconnected state and the second switch is at a disconnected state.

17. An integrated circuit comprising:

an asymmetry upper threshold circuit having an upper-branch output node configured to output an upper-branch enabling signal generated from an input voltage signal, wherein the asymmetry upper threshold circuit is configured to set the upper-branch enabling signal to a first upper-branch logic level in response to the input voltage signal rising across a main upper threshold, and configured to set the upper-branch enabling signal to a second upper-branch logic level in response to the input voltage signal falling across a supplementary upper threshold, and wherein the supplementary upper threshold is higher than the main upper threshold;

an asymmetry lower threshold circuit having a lower-branch output node configured to output a lower-branch enabling signal generated from the input voltage signal, wherein the asymmetry lower threshold circuit is configured to set the lower-branch enabling signal to a first lower-branch logic level in response to the input voltage signal falling across a main lower threshold, and configured to set the lower-branch enabling signal to a second lower-branch logic level in response to the input voltage signal rising across a supplementary lower threshold, and wherein the supplementary lower threshold is lower than the main lower threshold; and a control circuit configured to change an output voltage signal from a first voltage level to a second voltage level in response to a condition that a logic level of the upper-branch enabling signal and a logic level of the lower-branch enabling signal are changed consecutively, wherein the control circuit includes a buffer output node configured to generate the output voltage signal which depends on a consecutive change of the upper-branch enabling signal and the lower-branch enabling signal.

18. The integrated circuit of claim 17, further comprising:

a threshold-selection signal circuit having a delay circuit therein and configured to generate a threshold-selection signal in response to a change of the output voltage signal.

19. The integrated circuit of claim 17, wherein the control circuit comprises:

a first switch configured to be controlled with the upper-branch enabling signal from the upper-branch output node; and a second switch configured to be controlled with the lower-branch enabling signal from the lower-branch output node, wherein the buffer output node is at an electric connection between the first switch and the second switch.

20. The integrated circuit of claim 17, wherein the control circuit comprises:

a first switch electrically connected between a first voltage node and the buffer output node; and a second switch electrically connected between the buffer output node and a second voltage node.

* * * * *